(12) United States Patent
Asao et al.

(10) Patent No.: US 7,333,359 B2
(45) Date of Patent: Feb. 19, 2008

(54) MAGNETIC RANDOM ACCESS MEMORY

(75) Inventors: Yoshiaki Asao, Yokohama (JP); Yoshihisa Iwata, Yokohama (JP); Yoshiaki Saito, Kawasaki (JP); Hiroaki Yoda, Kawasaki (JP); Tomomasa Ueda, Yokohama (JP); Minoru Amano, Sagamihara (JP); Shigeki Takahashi, Yokohama (JP); Tatsuya Kishi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 450 days.

(21) Appl. No.: 10/419,873

(22) Filed: Apr. 22, 2003

(65) Prior Publication Data
US 2003/0214862 A1 Nov. 20, 2003

(30) Foreign Application Priority Data
Apr. 22, 2002 (JP) ............................. 2002-119366

(51) Int. Cl.
*G11C 11/00* (2006.01)
(52) U.S. Cl. ..................................................... 365/158
(58) Field of Classification Search ................. 365/158
See application file for complete search history.

(56) References Cited
U.S. PATENT DOCUMENTS
5,940,319 A 8/1999 Durlam et al.
6,548,849 B1* 4/2003 Pan et al. ................... 257/296
6,741,513 B2* 5/2004 Honigschmid et al. 365/230.03
2005/0274984 A1 12/2005 Hosotani et al.

FOREIGN PATENT DOCUMENTS
JP 2000-196030 7/2000
JP 2001-284550 10/2001
WO WO 00/38191 6/2000

OTHER PUBLICATIONS
Roy Scheuerlein, et al. "A 10NS Read and Write Non-Volatile Memory Array Using a Magentic Tunnel Junction and FET Switch in Each Cell," ISSCC 2000 Technical Digest, 2000 IEEE International Solid-State Circuits Conference, Feb. 8, 2000.

* cited by examiner

Primary Examiner—Evan Pert
(74) Attorney, Agent, or Firm—Oblon, Spivak, McClelland, Maier & Neustadt, P.C.

(57) ABSTRACT

A write word line is disposed right under a MTJ element. The write word line extends in an X direction, and side and lower surfaces of the write word line are coated with a hard magnetic material and yoke material. The hard magnetic material is magnetized by a surplus current passed through the write word line, and a characteristic of the MTJ element is corrected by residual magnetization. A data selection line (read/write bit line) is disposed right on the MTJ element. The data selection line extends in a Y direction intersecting with the X direction, and a part of the surface of the data selection line is coated with the yoke material.

12 Claims, 25 Drawing Sheets

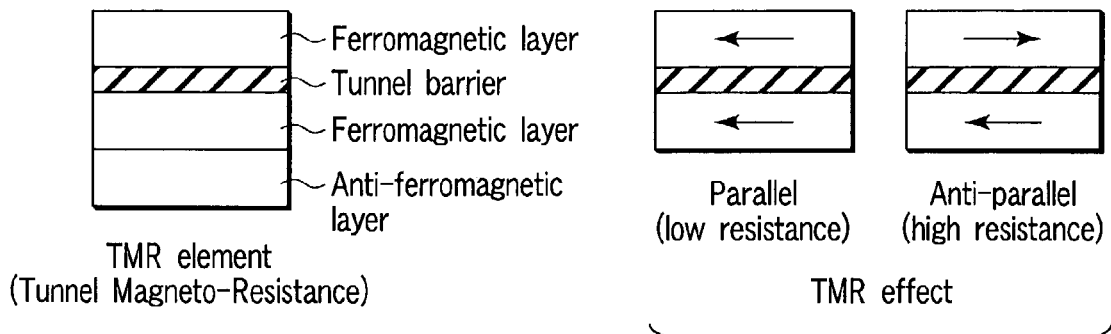
FIG. 1
PRIOR ART
FIG. 2
PRIOR ART
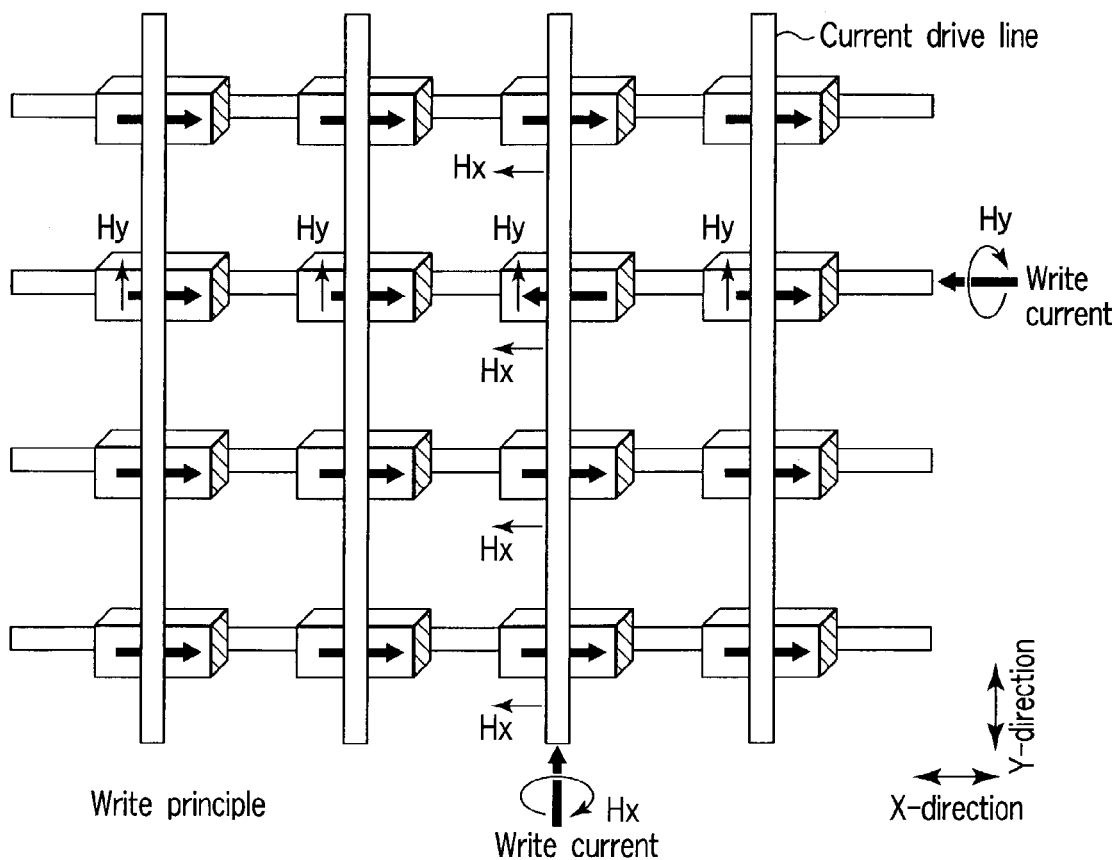
FIG. 3 PRIOR ART

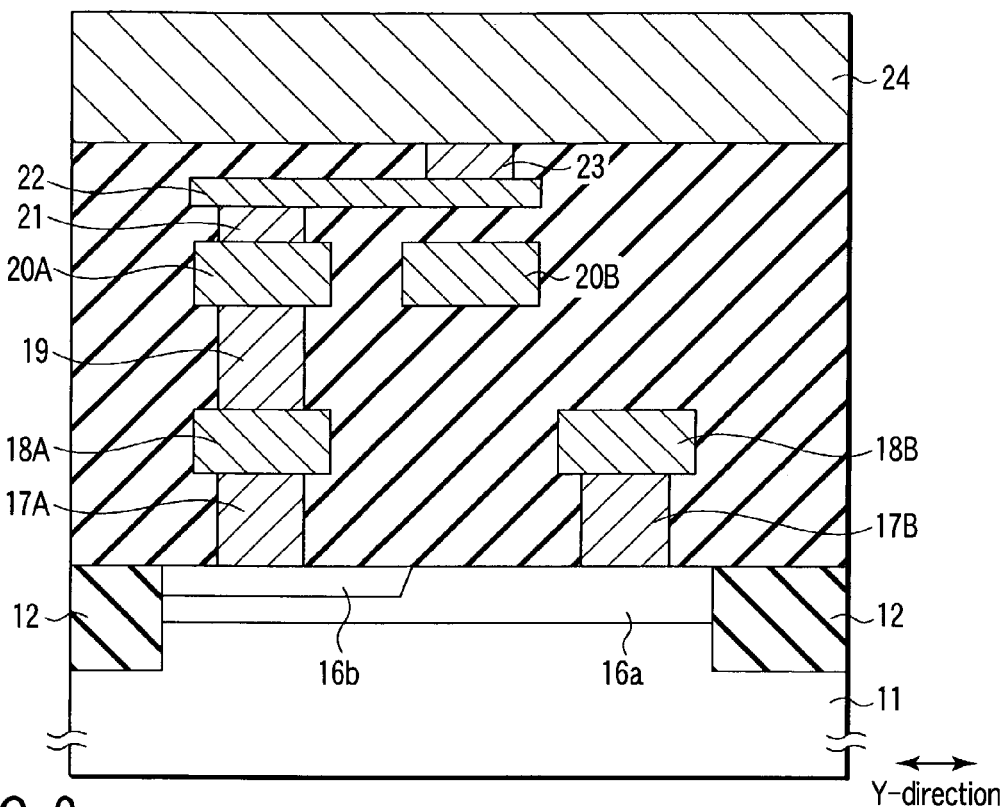
F I G. 9
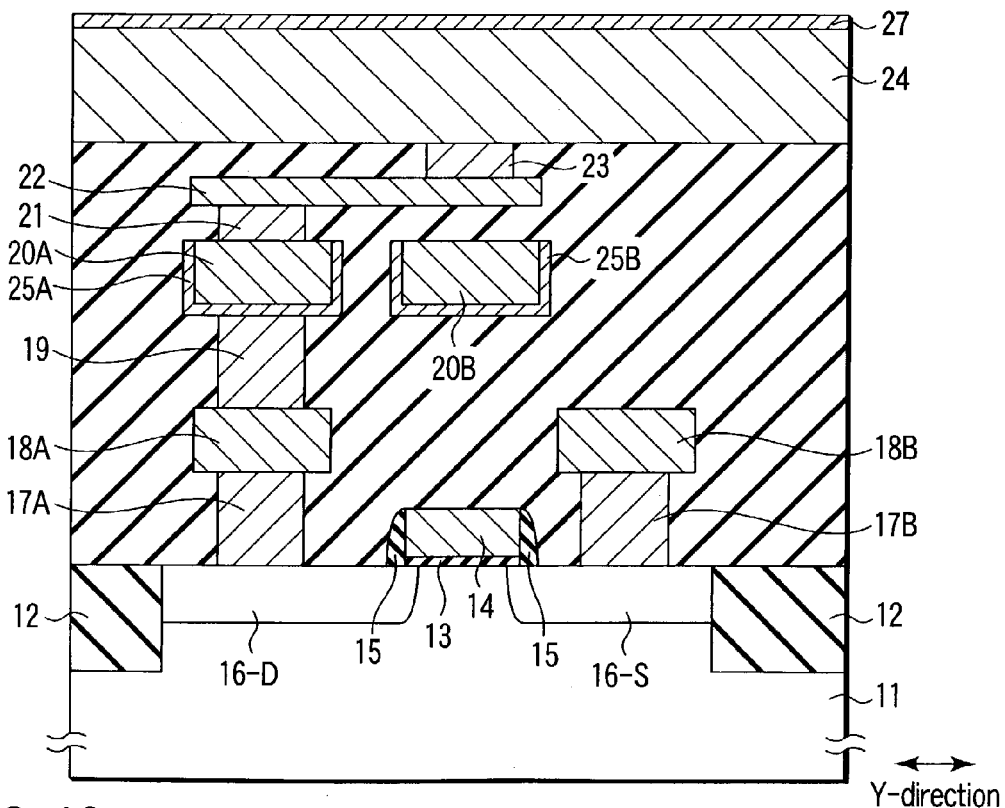
F I G. 10

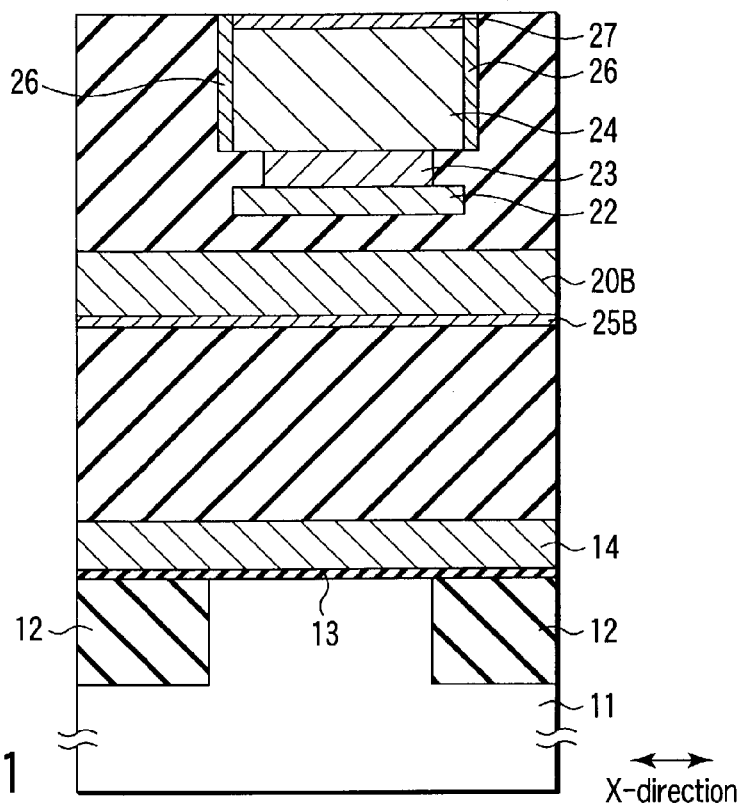
F I G. 11
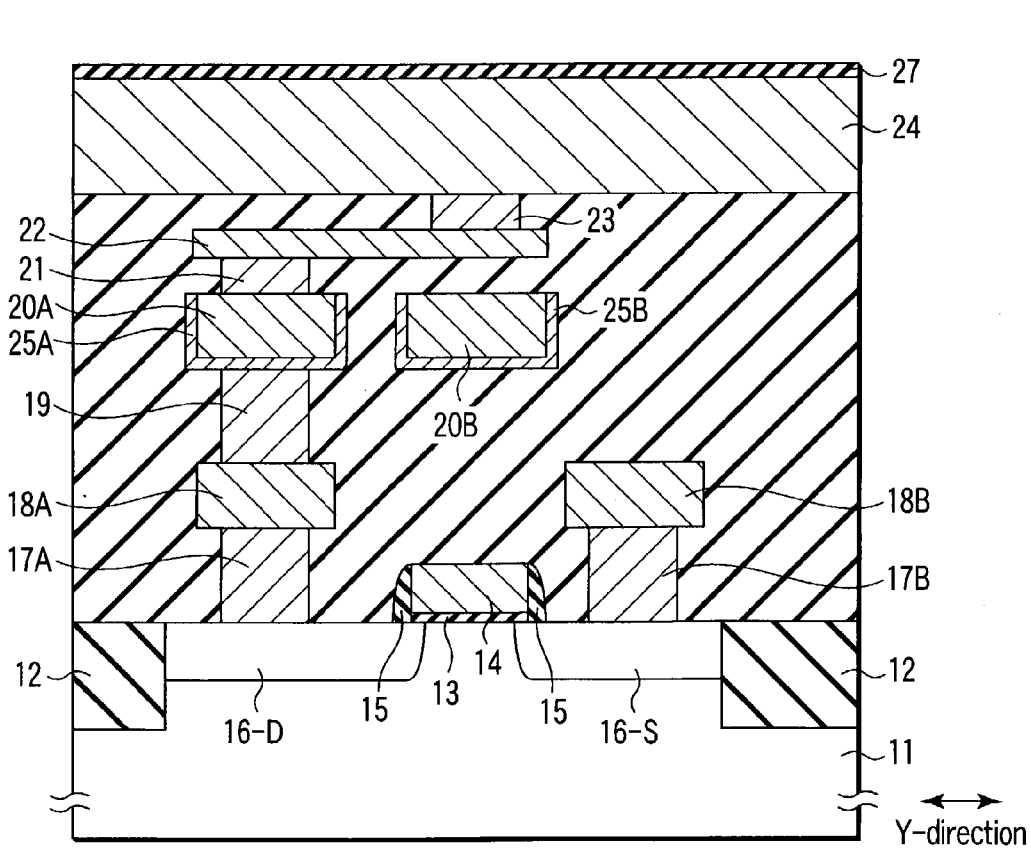
F I G. 12

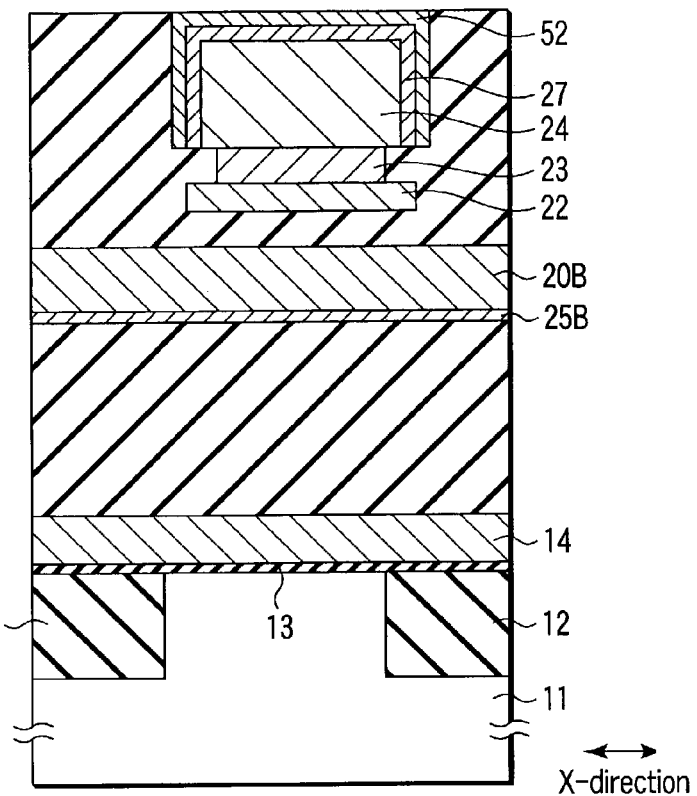
F I G. 25
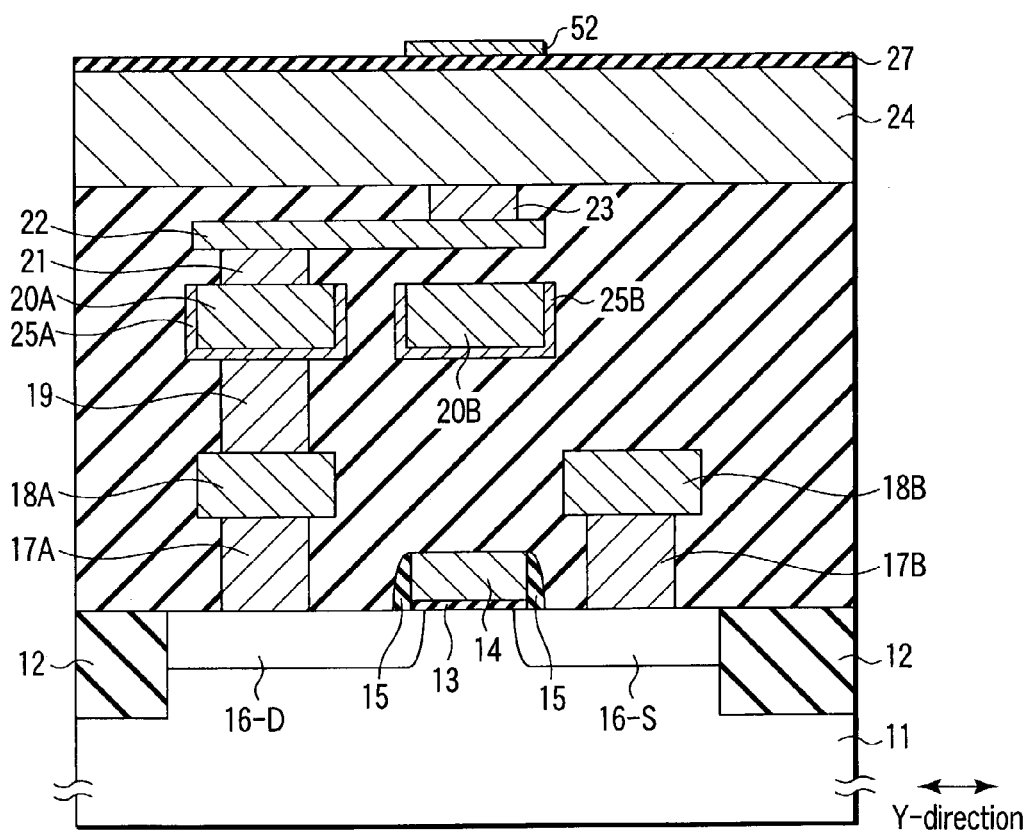
F I G. 26

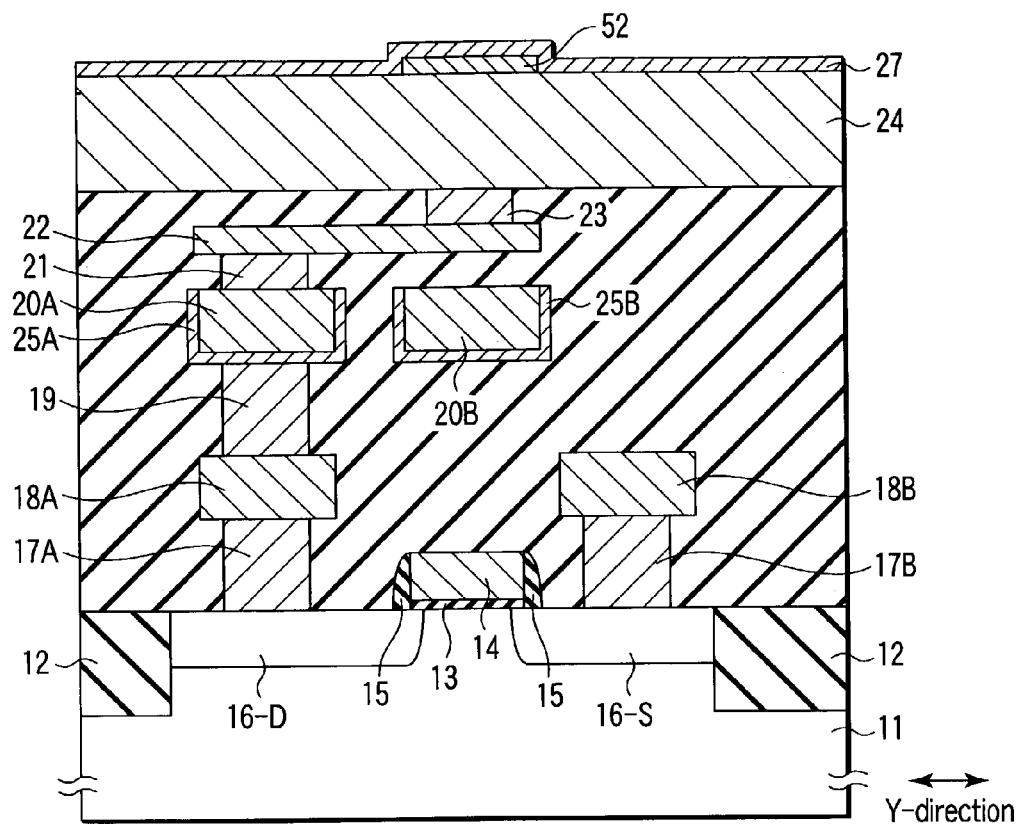
F I G. 32
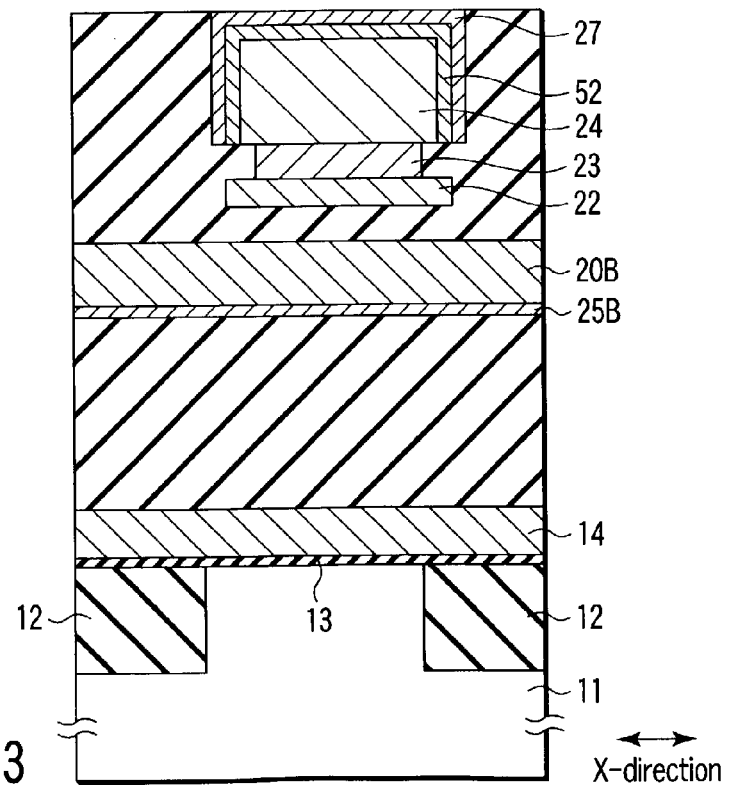
F I G. 33

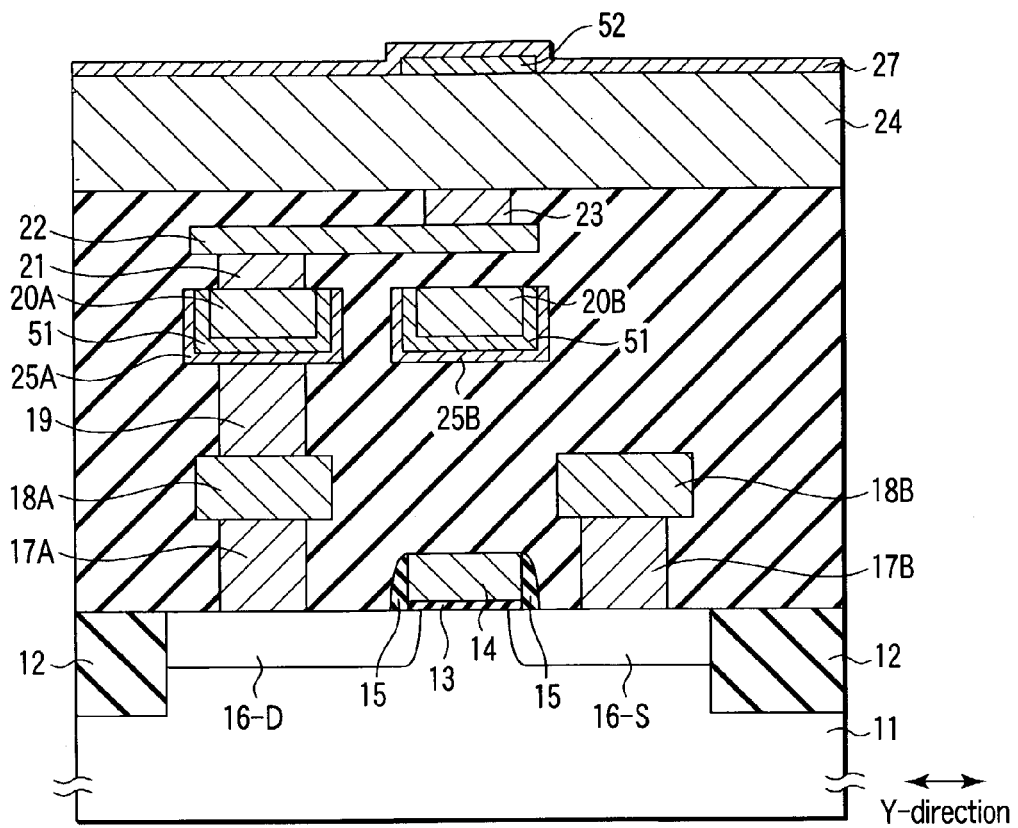
F I G. 34
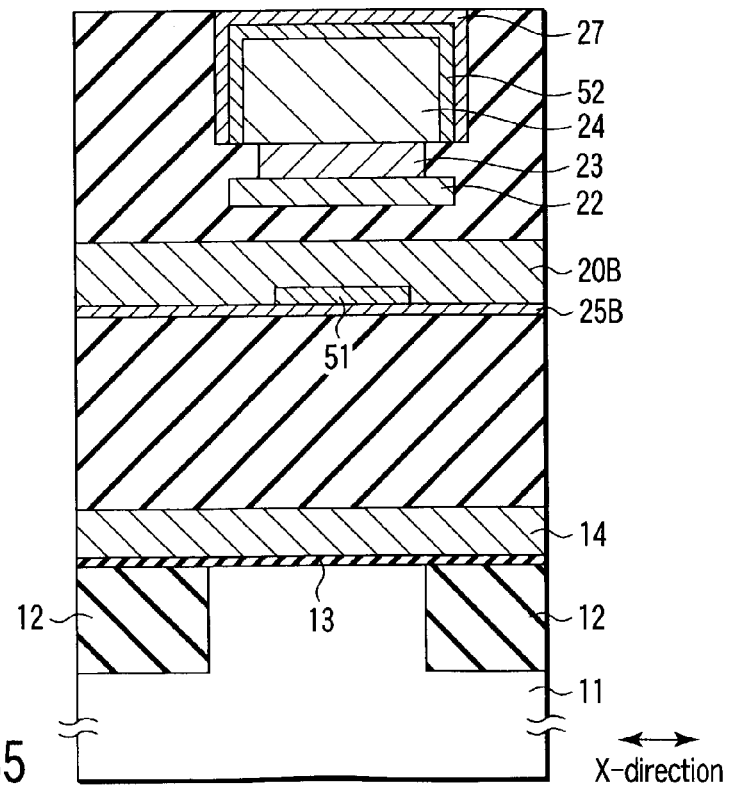
F I G. 35

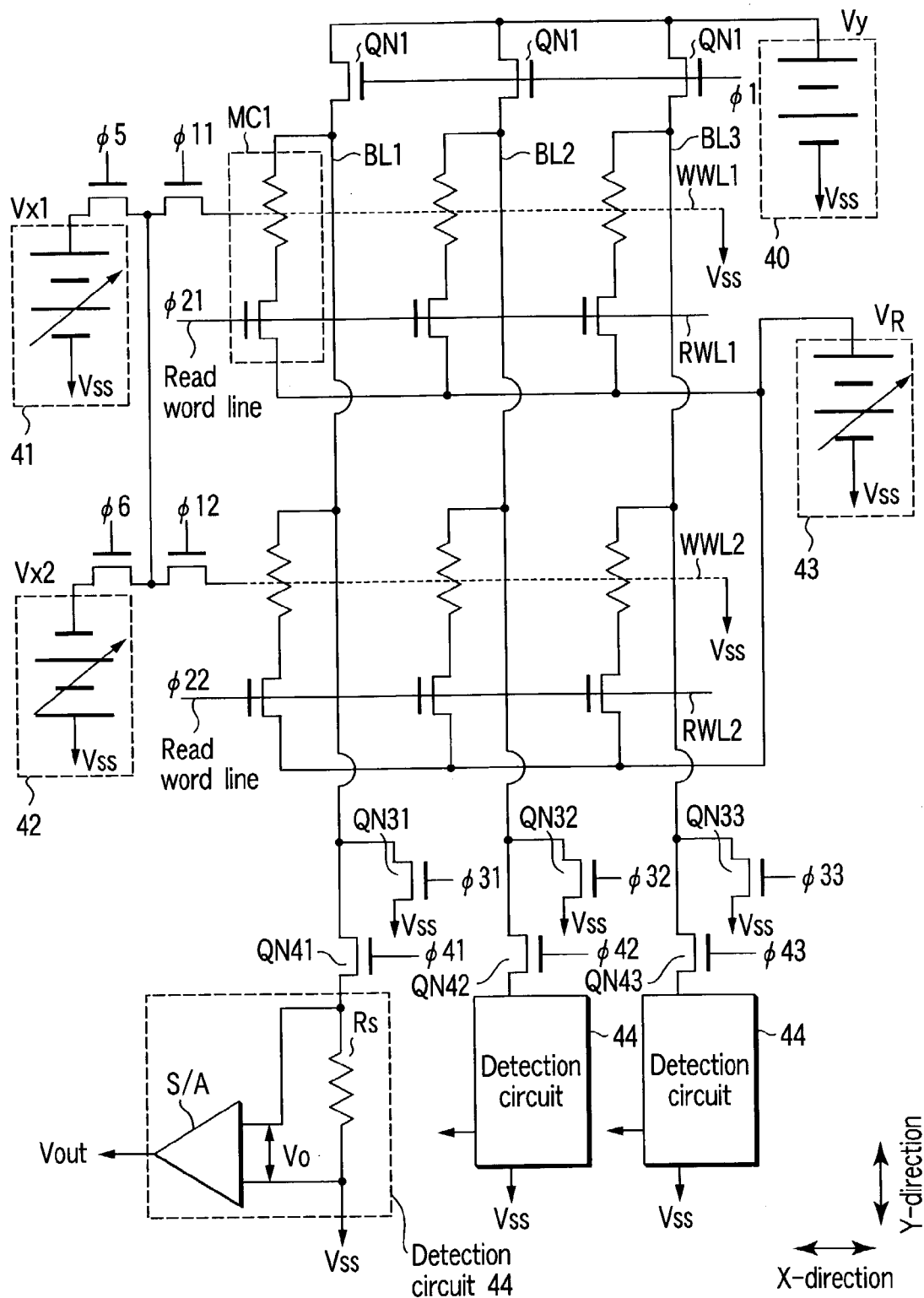
F I G. 38

MAGNETIC RANDOM ACCESS MEMORY

CROSS-REFERENCE TO RELATED APPLICATIONS

This application is based upon and claims the benefit of priority from the prior Japanese Patent Application No. 2002-119366, filed Apr. 22, 2002, the entire contents of which are incorporated herein by reference.

BACKGROUND OF THE INVENTION

1. Field of the Invention

The present invention relates to a magnetic random access memory (MRAM) in which a MTJ (Magnetic Tunnel Junction) element for storing "1", "0"-data by a tunneling magneto resistive effect is used to constitute a memory cell.

2. Description of the Related Art

In recent years, a large number of memories in which data is stored by a new principle have been proposed, and among the memories, there is a memory which has been proposed by Roy Scheuerlein et. al. and in which a tunneling magneto resistive (hereinafter referred to as TMR) effect is used (e.g., see ISSCC2000 Technical Digest p.128 "A 10 ns Read and Write Non-Volatile Memory Array Using a Magnetic Tunnel Junction and FET Switch in each Cell").

In the magnetic random access memory, "1", "0"-data is stored by a MTJ element. As shown in FIG. 1, the MTJ element includes a structure in which an insulating layer (tunnel barrier) is held between two magnetic layers (ferromagnetic layers). The data stored in the MTJ element is judged by judging whether directions of spins of two magnetic layers are parallel or anti-parallel to each other.

Here, as shown in FIG. 2, "parallel" means that the directions of spins of two magnetic layers (magnetization directions) are the same, and "anti-parallel" means that the directions of spins of two magnetic layers are opposite (the directions of arrows indicate the directions of spins).

It is to be noted that an anti-ferromagnetic layer is usually disposed in one of two magnetic layers. The anti-ferromagnetic layer is a member for fixing the direction of spins of the magnetic layer on one side and changing only the direction of spins on the other side to easily rewrite data.

The magnetic layer whose direction of spins is fixed is referred to as a fixed or pinned layer. Moreover, the magnetic layer whose direction of spins can freely be changed in accordance with write data is referred to as a free or storage layer.

As shown in FIG. 2, when the directions of spins of two magnetic layers are parallel to each other, tunnel resistance of the insulating layer (tunnel barrier) held between these two magnetic layers becomes lowest. This state is a "1"-state. Moreover, when the directions of spins of two magnetic layers are anti-parallel to each other, the tunnel resistance of the insulating layer (tunnel barrier) held between these two magnetic layers becomes highest. This state is a "0"-state.

Next, a write operation principle with respect to the MTJ element will briefly be described with reference to FIG. 3.

The MTJ element is disposed in an intersection of a write word line and data selection line (read/write bit line) which intersect with each other. Moreover, write is achieved by passing a current through the write word line and data selection line, and using a magnetic field made by the current flowing through opposite wirings to set the direction of spins of the MTJ element to be parallel or anti-parallel.

For example, a magnetization easy axis of the MTJ element corresponds to an X direction, the write word line extends in the X direction, and the data selection line extends in a Y direction crossing at right angles to the X direction. In this case, at a write time, the current flowing in one direction is passed through the write word line, and the current flowing in one or the other direction is passed through the data selection line in accordance with write data.

When the current flowing in one direction is passed through the data selection line, the direction of spins of the MTJ element becomes parallel ("1"-state). On the other hand, when the current flowing in the other direction is passed through the data selection line, the direction of spins of the MTJ element becomes anti-parallel ("0"-state).

A mechanism in which the direction of spins of the MTJ element changes is as follows.

As shown by a TMR curve of FIG. 4, when a magnetic field Hx is applied in a long-side (easy-axis) direction of the MTJ element, a resistance value of the MTJ element changes, for example, by about 17%. This change ratio, that is, a ratio of a resistance value before the change to that after the change is referred to as an MR ratio.

It is to be noted that the MR ratio changes by a property of the magnetic layer. At present, the MTJ element whose MR ratio is about 50% has also been obtained.

A synthesized magnetic field of the magnetic field Hx of the easy-axis direction and magnetic field Hy of a hard-axis direction is applied to the MTJ element. As shown by a solid line of FIG. 5, a size of the magnetic field Hx of the easy-axis direction necessary for changing the resistance value of the MTJ element also changes by the size of the magnetic field Hy of the hard-axis direction. This phenomenon can be used to write the data into only the MTJ element existing in the intersection of the selected write word line and data selection line among arrayed memory cells.

This state will further be described with reference to an asteroid curve of FIG. 5.

The asteroid curve of the MTJ element is shown, for example, by the solid line of FIG. 5. That is, when the size of the synthesized magnetic field of the magnetic field Hx of the easy-axis direction and magnetic field Hy of the hard-axis direction is outside the asteroid curve (solid line) (e.g., positions of black circles), the direction of spins of the magnetic layer can be reversed.

Conversely, when the size of the synthesized magnetic field of the magnetic field Hx of the easy-axis direction and magnetic field Hy of the hard-axis direction is inside the asteroid curve (solid line) (e.g., positions of white circles), the direction of spins of the magnetic layer cannot be reversed.

Therefore, when the sizes of the magnetic field Hx of the easy-axis direction and magnetic field Hy of the hard-axis direction are changed, and the position of the size of the synthesized magnetic field in an Hx-Hy plane is changed, the write of the data with respect to the MTJ element can be controlled.

It is to be noted that read can easily be performed by passing the current through the selected MTJ element, and detecting the resistance value of the MTJ element.

For example, switch elements are connected in series to the MTJ elements, and only the switch element connected to a selected read word line is turned on to form a current path. As a result, since the current flows only through the selected MTJ element, the data of the MTJ element can be read.

In a magnetic random access memory, as described above, the data is written by passing a write current through the write word line and data selection line (read/write bit line), and allowing the synthesized magnetic field generated thereby to act on the MTJ element.

Therefore, in order to write the data with good efficiency, it is important to apply the synthesized magnetic field to the MTJ element with good efficiency. When the synthesized magnetic field is efficiently applied to the MTJ element, reliability of the write operation is enhanced, the write current is further reduced, and low power consumption can be realized.

Then, in recent years, a magnetic random access memory has been proposed including a structure in which a part of the surface of the write word line and data selection line is coated with a yoke material having an effect of concentrating a magnetic flux and having a high permeability.

In order to write the data efficiently and exactly, as described above, it is important to apply the synthesized magnetic field to the MTJ element with good efficiency. It is also important to impart the same characteristic (TMR curve) to MTJ elements which constitute the memory cell array for the following reason. When the characteristics of the MTJ elements differ, and even when the data is written on the same conditions, the MTJ element in which exact data cannot be written is generated with an increasing possibility.

However, in actual, because of various problems in a manufacturing process (flatness of the substrate of the memory cell, dispersion of a film thickness in a wafer, and the like), the characteristics (TMR curves) of the MTJ elements are not the same. It is to be noted that as direct causes for the dispersion of the characteristics, a leak magnetic field (magnetostatic coupling) which acts on the free layer (storage layer) from the pinned layer (fixed layer) of the MTJ element, and a phenomenon (topological coupling) in which a tunnel barrier layer of the MTJ element is not flat and has a pole are assumed.

As a result, for example, when ideal characteristics are shown by the TMR curve in FIG. 4, the MTJ elements having the characteristics shown in FIGS. 6 and 7 coexist in the wafer or chip. In this case, for example, in design, even when the write current sufficient for changing the magnetization direction (direction of spins) of the MTJ element is passed, the magnetization direction of the MTJ element does not change. This situation occurs, and the reliability of the magnetic random access memory drops.

Therefore, in the magnetic random access memory, when the dispersion of the characteristic (TMR curve) of the MTJ element can be corrected after assembly, this can contribute to the enhancement of the reliability.

BRIEF SUMMARY OF THE INVENTION

According to a first aspect of the present invention, there is provided a magnetic random access memory comprising: a memory cell which is formed on a semiconductor substrate and in which a magneto resistive effect is used to store data; a first write line which is disposed right under the memory cell and which extends in a first direction; a second write line which is disposed right on the memory cell and which extends in a second direction intersecting with the first direction; and a hard magnetic material with which a part of the surface of the first write line is coated.

According to a second aspect of the present invention, there is provided a magnetic random access memory comprising: a memory cell which is formed on a semiconductor substrate and in which a magneto resistive effect is used to store data; a first write line which is disposed right under the memory cell and which extends in a first direction; a second write line which is disposed right on the memory cell and which extends in a second direction intersecting with the first direction; and a hard magnetic material with which a part of the surface of the second write line is coated.

According to a third aspect of the present invention, there is provided a magnetic random access memory comprising: memory cells in which a magneto resistive effect is used to store data; a write line shared by the memory cells; and hard magnetic materials which are disposed in a part of the surface of the write line right under the memory cells.

According to a fourth aspect of the present invention, there is provided a correcting method of write characteristics of memory cells of a magnetic random access memory, which is applied to the above-described magnetic random access memory and which comprises the steps of: inspecting the write characteristics of the memory cells; passing a surplus current which is larger than a write current passed through a write line at a write time through the write line; fixing a magnetization direction of hard magnetic materials; and correcting the write characteristics of the memory cells.

According to a fifth aspect of the present invention, there is provided a manufacturing method of a magnetic random access memory, comprising: forming an insulating layer on a semiconductor substrate; forming a wiring trench in the insulating layer; forming hard magnetic materials on the insulating layer and on bottom and side wall portions of the wiring trench; filling the wiring trench with a conductive material to form a write line; removing the hard magnetic material on the insulating layer; allowing the hard magnetic material to remain in the bottom and side wall portions of the wiring trench; and forming a MTJ element right on the write line.

According to a sixth aspect of the present invention, there is provided a manufacturing method of a magnetic random access memory, comprising: forming a MTJ element on a semiconductor substrate; forming an insulating layer on the MTJ element; forming a wiring trench in the insulating layer on the MTJ element; forming a hard magnetic material in a side wall portion of the wiring trench; and filling the wiring trench with a conductive material to form a write line.

BRIEF DESCRIPTION OF THE SEVERAL VIEWS OF THE DRAWING

FIG. 1 is a diagram showing a structure example of a MTJ element;

FIG. 2 is a diagram showing two states of the MTJ element;

FIG. 3 is a diagram showing a write operation principle of a magnetic random access memory;

FIG. 9 is a sectional view showing Reference Example 1 of the magnetic random access memory according to the present invention;

FIG. 10 is a sectional view showing Reference Example 2 of the magnetic random access memory according to the present invention;

FIG. 11 is a sectional view showing Reference Example 2 of the magnetic random access memory according to the present invention;

FIG. 12 is a sectional view showing Reference Example 2 of the magnetic random access memory according to the present invention;

FIG. 25 is a sectional view showing Example 2 of the magnetic random access memory according to the present invention;

FIG. 26 is a sectional view showing Example 2 of the magnetic random access memory according to the present invention;

FIG. 32 is a sectional view showing the modification example of Example 2;

FIG. 33 is a sectional view showing the modification example of Example 2;

FIG. 34 is a sectional view showing Example 3 of the magnetic random access memory according to the present invention;

FIG. 35 is a sectional view showing Example 3 of the magnetic random access memory according to the present invention;

FIG. 38 is a circuit diagram showing a structure example of a cell array of the magnetic random access memory according to the present invention;

DETAILED DESCRIPTION OF THE INVENTION

An magnetic random access memory according to an embodiment of the present invention will be described hereinafter in detail with reference to the drawings.

1. REFERENCE EXAMPLE 1

First, to describe the magnetic random access memory according to the embodiment of the present invention, a device structure as assumption will be described.

It is to be noted that this device structure is described for a purpose of briefly describing the magnetic random access memory according to the embodiment of the present invention, and the present invention is not limited to this device structure.

Figure 8:
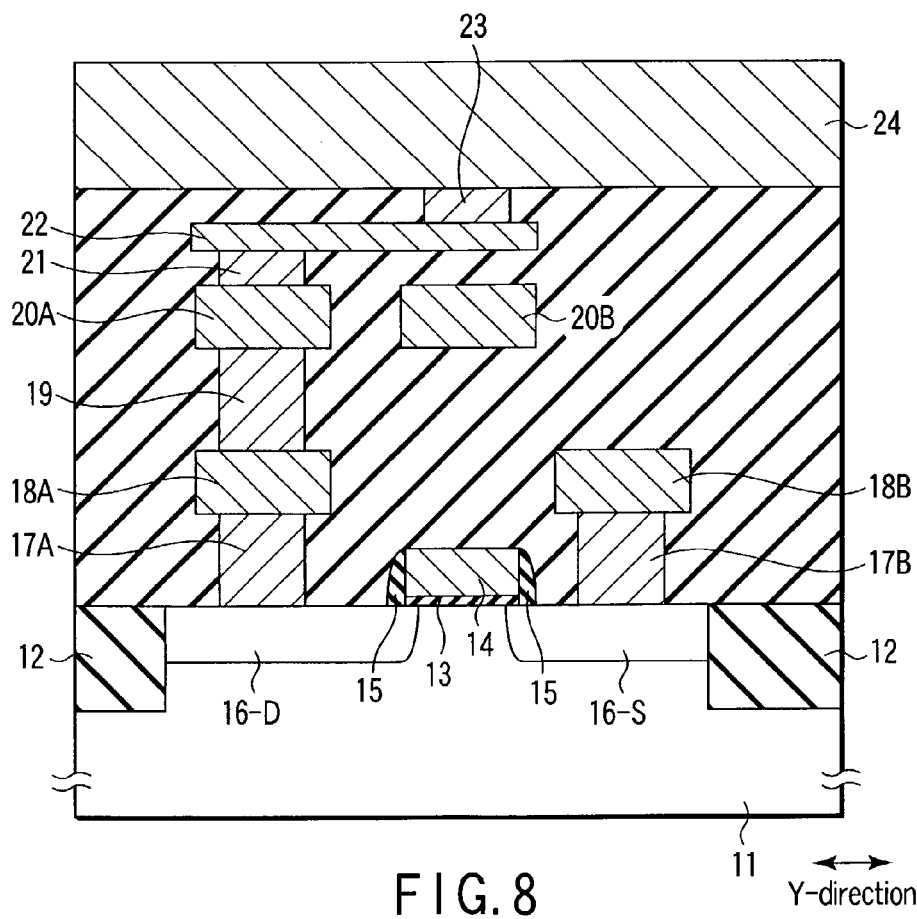
FIG. 8 is a sectional view showing Reference Example 1 of the magnetic random access memory according to the present invention.

FIGS. 8 and 9 show the device structure which is the assumption of the magnetic random access memory according to the embodiment of the present invention.

In a semiconductor substrate (e.g., p-type silicon substrate, p-type well region, and the like) 11, an element isolation insulating layer 12 including a shallow trench isolation (STI) structure is formed. A region surrounded by the element isolation insulating layer 12 is an element region in which a read selection switch (e.g., MOS transistor, diode, and the like) is formed.

In the device structure of FIG. 8, the read selection switch is constituted of the MOS transistor (n-channel type MOS transistor). On the semiconductor substrate 11, a gate insulating layer 13, gate electrode 14, and side wall insulating layer 15 are formed. The gate electrode 14 extends in an X direction, and functions as a read word line for selecting a read cell (MTJ element) at a read operation time.

In the semiconductor substrate 11, a source region (e.g., n-type diffused layer) 16-S and drain region (e.g., n-type diffused layer) 16-D are formed. The gate electrode (read word line) 14 is disposed in a channel region between the source region 16-S and drain region 16-D.

In the device structure of FIG. 9, a read selection switch is constituted of a diode. In the semiconductor substrate 11, a cathode region (e.g., the n-type diffused layer) 16a and anode region (e.g., p-type diffused layer) 16b are formed.

One of metal layers constituting a first metal wiring layer functions as an intermediate layer 18A in which contact plugs are vertically stacked, and another layer functions as a source line 18B (in FIG. 8) or read word line 18B (in FIG. 9).

In the device structure of FIG. 8, the intermediate layer 18A is electrically connected to the drain region 16-D of the read selection switch (MOS transistor) via a contact plug 17A. The source line 18B is electrically connected to the source region 16-S of the read selection switch via a contact plug 17B. The source line 18B extends in the X direction in the same manner as in the gate electrode (read word line) 14.

In the device structure of FIG. 8, the intermediate layer 18A is electrically connected to the anode region 16b of the read selection switch (diode) via the contact plug 17A. The read word line 18B is electrically connected to the cathode region 16a of the read selection switch via the contact plug 17B. The read word line 18B extends in the X direction.

One of the metal layers constituting a second metal wiring layer functions as an intermediate layer 20A in which contact plugs are vertically stacked, and another layer functions as a write word line 20B. The intermediate layer 20A is electrically connected to the intermediate layer 18A via a contact plug 19. The write word line 20B extends, for example, in the X direction.

One of the metal layers constituting a third metal wiring layer functions as a lower electrode 22 of a MTJ element 23. The lower electrode 22 is electrically connected to the intermediate layer 20A via a contact plug 21. The MTJ element 23 is mounted on the lower electrode 22. Here, the MTJ element 23 is disposed right on the write word line 20B, and formed in a rectangular shape long in the X direction (magnetization easy axis corresponds to the X direction).

One of the metal layers constituting a fourth metal wiring layer functions as a data selection line (read/write bit line) 24. The data selection line 24 is electrically connected to the MTJ element 23, and extends in a Y direction.

It is to be noted that the structure of the MTJ element 23 is not especially limited. The structure shown in FIG. 1 or another structure may also be used. Moreover, the MTJ element 23 may also be of a multi-valued storage type in which data of bits can be stored.

The ferromagnetic layer of the MTJ element 23 is not especially limited. For example, in addition to Fe, Co, Ni, or alloy of these metals, magnetite large in spin polarization ratio, and oxides such as $CrO_2$, $RXMnO_{3-y}$ (R: rare earth, X: Ca, Ba, Sr), Heusler alloys such as NiMnSb and PtMnSb can be used.

Even when the ferromagnetic layer contains some non-magnetic elements such as Ag, Cu, Au, Al, Mg, Si, Bi, Ta, B, C, O, N, Pd, Pt, Zr, Ir, W, Mo, Nb, there is no problem as long as ferromagnetism is not lost.

If the thickness of the ferromagnetic layer is too small, super-paramagnetism results. Then, the ferromagnetic layer needs to have a thickness to such an extent that at least the super-paramagnetism does not result. Concretely, the thickness of the ferromagnetic layer is set to 0.1 nm or more, preferably not less than 0.4 nm and not more than 100 nm.

As a diamagnetic layer of the MTJ element 23, for example, Fe—Mn, Pt—Mn, Pt—Cr—Mn, Ni—Mn, Ir—Mn, NiO, $Fe_2O_3$, and the like can be used.

As the insulating layer (tunnel barrier) of the MTJ element 23, for example, dielectric materials such as $Al_2O_3$, $SiO_2$, MgO, AlN, $Bi_2O_3$, $MgF_2$, $CaF_2$, $SrTiO_2$, and $AlLaO_3$ can be used. Even when an oxygen loss, nitrogen loss, or fluorine loss exists in these materials, there is no problem.

The thickness of the insulating layer (tunnel barrier) may be as small as possible, but there is not especially any determined limitation for realizing the function. Additionally, for the sake of manufacturing, the thickness of the insulating layer is set to 10 nm or less.

2. REFERENCE EXAMPLE 2

Next, with respect to the device structure of Reference Example 1, a device structure will be described which has been proposed to concentrate the magnetic field on the MTJ element with good efficiency.

Figure 13:
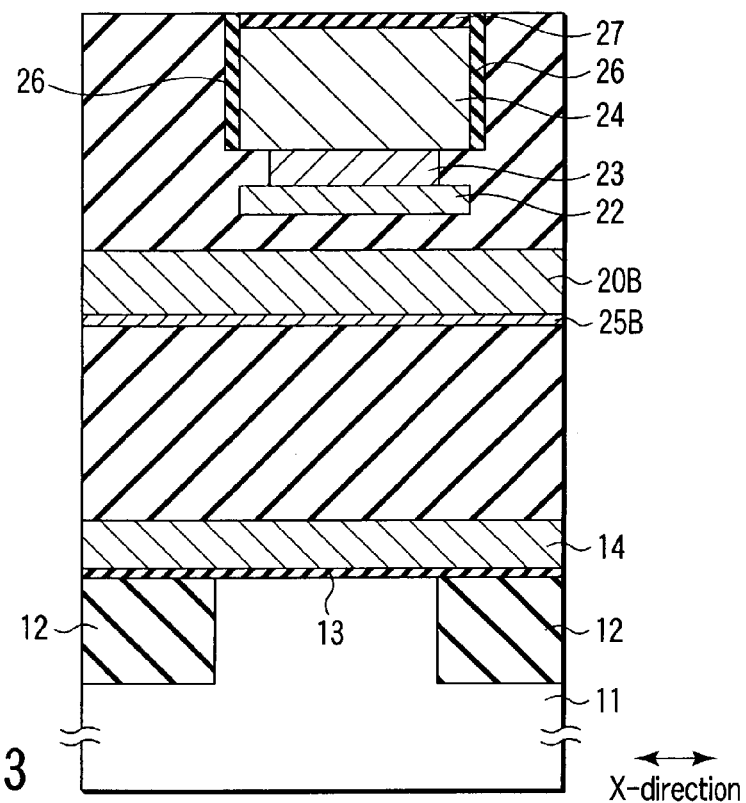
FIG. 13 is a sectional view showing Reference Example 2 of the magnetic random access memory according to the present invention.

FIGS. 10 to 13 show the device structure which is the assumption of the magnetic random access memory according to the embodiment of the present invention. It is to be noted that FIGS. 10 and 12 show sections in the Y direction, FIG. 11 shows a section of a MTJ element portion in the X direction, and FIG. 13 shows a section of the MTJ element portion of FIG. 12 in the X direction. The X direction crosses at right angles to the Y direction.

In the semiconductor substrate (e.g., p-type silicon substrate, p-type well region, and the like) 11, the element isolation insulating layer 12 including the shallow trench isolation (STI) structure is formed. The region surrounded by the element isolation insulating layer 12 is the element region in which the read selection switch (e.g., MOS transistor) is formed.

In the present device structure, the read selection switch is constituted of the MOS transistor (n-channel type MOS transistor). On the semiconductor substrate 11, gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., n-type diffused layer) 16-S and drain region (e.g., n-type diffused layer) 16-D are formed. The gate electrode (read word line) 14 is disposed in the channel region between the source region 16-S and drain region 16-D.

One of metal layers constituting the first metal wiring layer functions as the intermediate layer 18A for vertically stacking contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction in the same manner as in the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as in the gate electrode (read word line) 14.

In the present device structure, the lower and side surfaces of the intermediate layer 20A and write word line 20B are coated with materials having high permeability, that is, yoke materials 25A, 25B. The yoke materials 25A, 25B for use herein are limited to materials which have conductivity.

A magnetic flux has a property of being concentrated on the material which has the high permeability. Therefore, when the material having the high permeability is used as a tractor of a line of magnetic force, a magnetic field Hy generated by a write current flowing through the write word line 20B can be concentrated on the MTJ element 23 with good efficiency.

To achieve the object of the present application, it is sufficient to coat the lower and side surfaces of the write word line 20B with the yoke material. Additionally, in actual, the yoke material is also formed on the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the present device structure, the upper and side surfaces of the data selection line 24 are coated with the materials having high permeability, that is, yoke materials 26, 27. The yoke materials 26, 27 for use can be constituted of the materials which have conductivity as shown in FIGS. 10 and 11, or can also be constituted of materials which have an insulating property as shown in FIGS. 12 and 13.

As described above, the magnetic flux has the property of being concentrated on the material which has the high permeability. Therefore, when the material having the high permeability is used as the tractor of the line of magnetic force, a magnetic field Hx generated by the write current flowing through the data selection line 24 can be concentrated on the MTJ element 23 with good efficiency at the write operation time.

It is to be noted that the structure of the MTJ element 23 is not especially limited. The structure shown in FIG. 1 or another structure may also be used. Moreover, the MTJ element 23 may also be of the multi-valued storage type in which data of bits can be stored.

In this device structure, the yoke material 25B is formed in the lower and side surfaces of the write word line 20B disposed right under the MTJ element 23. Moreover, the yoke materials 26, 27 are formed in the upper and side surfaces of the data selection line (read/write bit line) 24 disposed right on the MTJ element 23.

In this case, it is preferable to form the write word line 20B and yoke material 25B using a damascene process. Conversely, when the write word line 20B and yoke material 25B are formed using a reactive ion etching (RIE) process, the process becomes very complicated, and this is realistically impossible.

On the other hand, the data selection line 24 and yoke materials 26, 27 may be formed using either the damascene process or RIE process.

3. EXAMPLE 1

Figure 14:
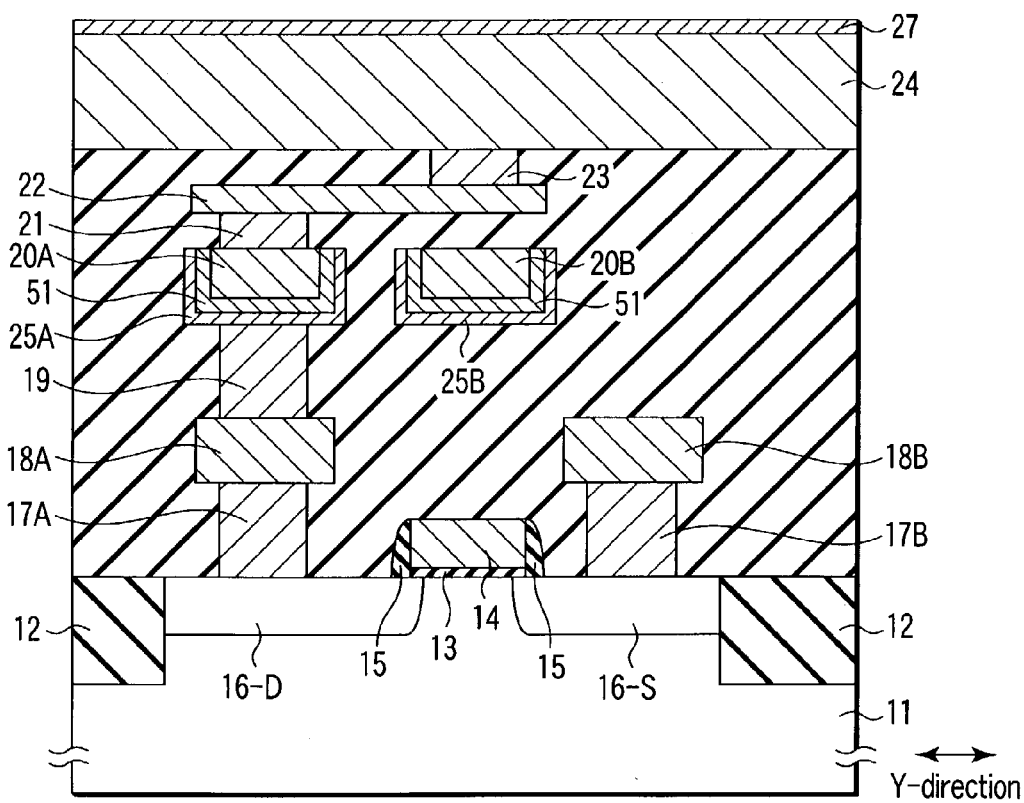
FIG. 14 is a sectional view showing Example 1 of the magnetic random access memory according to the present invention.
Figure 15:
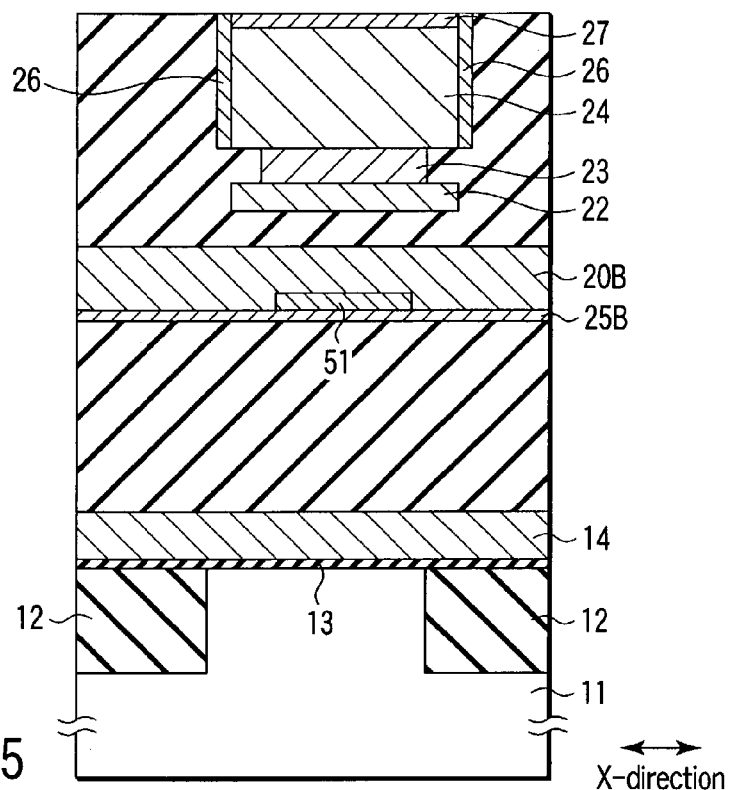
FIG. 15 is a sectional view showing Example 1 of the magnetic random access memory according to the present invention.
Figure 16:
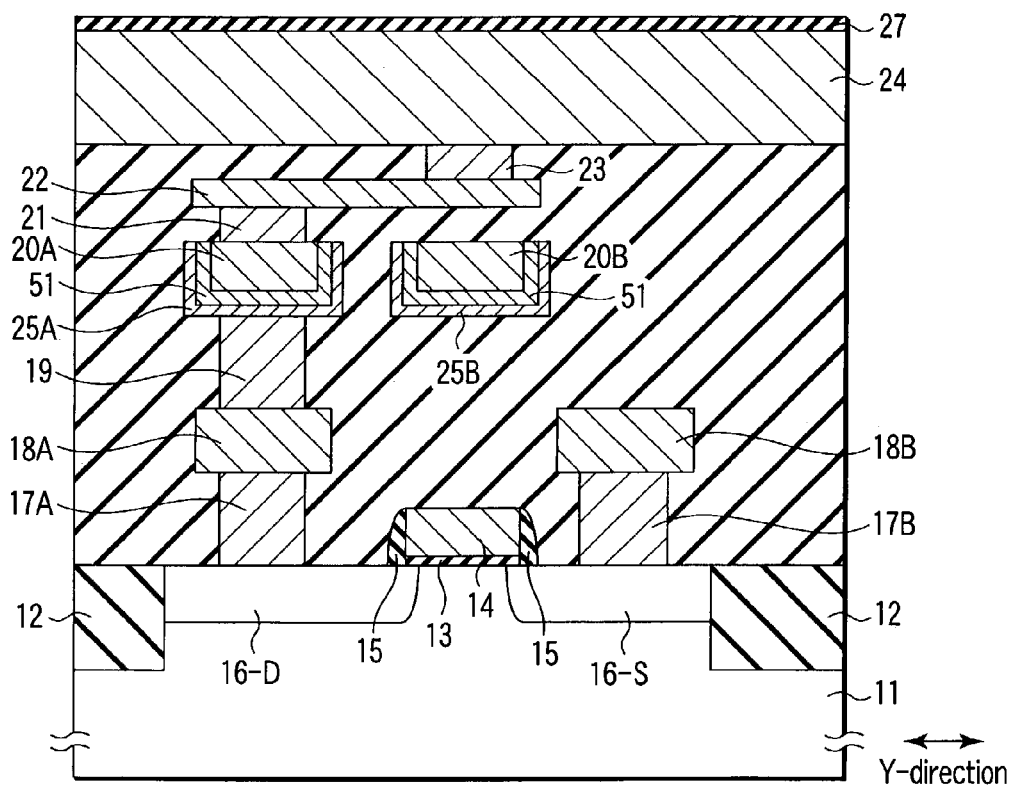
FIG. 16 is a sectional view showing Example 1 of the magnetic random access memory according to the present invention.
Figure 17:
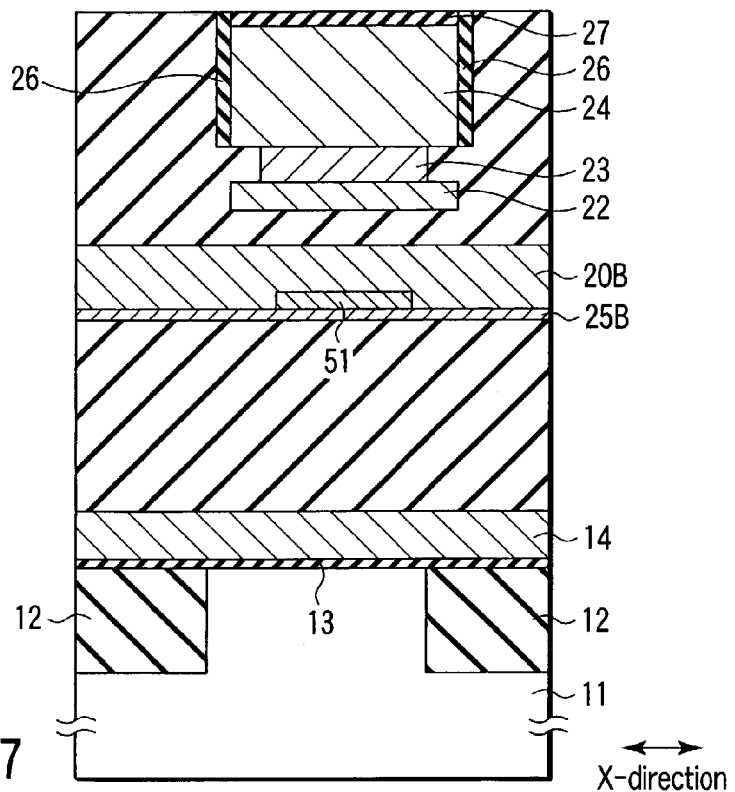
FIG. 17 is a sectional view showing Example 1 of the magnetic random access memory according to the present invention.

FIGS. 14 to 17 show the device structure of the magnetic random access memory according to Example 1 of the present invention. It is to be noted that FIGS. 14 and 16 show the sections in the Y direction, FIG. 15 shows the section of the MTJ element portion of FIG. 14 in the X direction, and FIG. 17 shows the section of the MTJ element portion of FIG. 16 in the X direction. The X direction crosses at right angles to the Y direction.

The characteristics of the device structure of the present example lie in that a part of the surface, concretely, the lower and side surfaces of the write word line 20B disposed right under the MTJ element 23 are coated with a hard magnetic material 51. The hard magnetic material 51 includes a magnetization easy axis in a direction crossing at right angles to a direction in which the write word line 20B extends.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the present device structure, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as in the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as in the gate electrode (read word line) 14.

In the present device structure, the lower and side surfaces of the intermediate layer 20A and write word line 20B are coated with the hard magnetic materials (e.g., iron, and the like) 51. When an external magnetic field acts on the hard magnetic materials 51, and even after the external magnetic field disappears, the hard magnetic materials have properties of having residual magnetization. In the present invention, the characteristic (TMR curve) of the MTJ element 23 is corrected by this residual magnetization.

A magnetization direction (direction of spins) of the hard magnetic material 51, that is, a correction direction of the characteristic (TMR curve) of the MTJ element 23 is determined by the direction of the current passed through the write word line 20B.

Here, the magnetization direction of the hard magnetic material 51 is determined by the current having the same value as that of a usual write current. Then, every time the write current is passed, the magnetization direction of the hard magnetic material 51 changes, and the hard magnetic material does not have a function of correcting the characteristic of the MTJ element 23. To solve the problem, when the magnetization direction of the hard magnetic material 51 is determined, a surplus current larger than the write current passed at a usual write operation time is passed through the write word line 20B.

Thereby, the magnetization direction of the hard magnetic material 51 is fixed, and the characteristic (TMR curve) of the MTJ element 23 is corrected in a constant direction. Moreover, even when the write current is passed at a usual write operation time, the magnetization direction of the hard magnetic material 51 does not change.

It is to be noted that the magnetization direction of the hard magnetic material 51 is determined, for example, in a test stage after assembly and before product shipping. Moreover, the characteristic of the MTJ element 23 in the magnetic random access memory (chip) is inspected, and the characteristic of the MTJ element 23 is corrected by a unit of the write word line 20B.

In the present device structure, the lower and side surfaces of the intermediate layer 20A and write word line 20B are further coated with the materials having the high permeability, that is, the yoke materials 25A, 25B. The hard magnetic materials 51 are disposed between the intermediate layer 20A and yoke material 25A and between the write word line 20B and yoke material 25B, respectively. The yoke materials 25A, 25B for use herein are limited to the materials which have conductivity.

It is to be noted that the magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

It is sufficient to coat the lower and side surfaces of the write word line 20B with the hard magnetic materials and yoke materials. Additionally, in actual, the hard magnetic materials and yoke materials are also formed in the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the present device structure, the upper and side surfaces of the data selection line 24 are coated with the materials having the high permeability, that is, yoke materials 26, 27. The yoke materials 26, 27 for use herein can be constituted of the materials which have conductivity as shown in FIGS. 14 and 15, or can also be constituted of the materials which have the insulating properties as shown in FIGS. 16 and 17.

It is to be noted that, as described above, the magnetic flux has the property of being concentrated on the material which has the high permeability. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which data of bits can be stored.

FIGS. 18 to 21 schematically show correction principles of the characteristic of the MTJ element.

Figure 4:
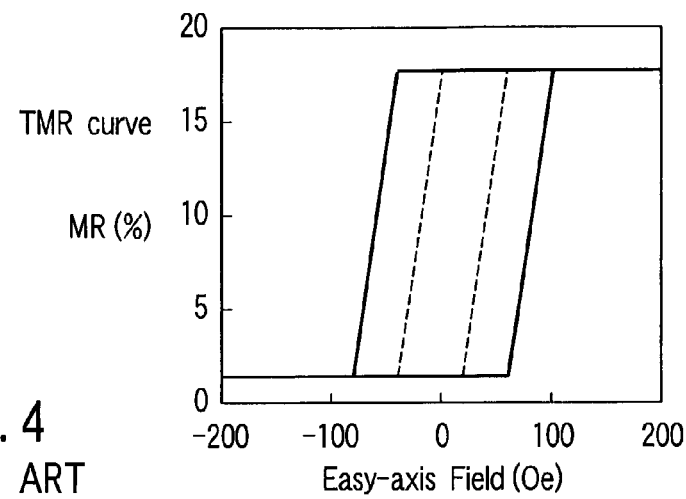
FIG. 4 is a diagram showing a TMR curve.
Figure 5:
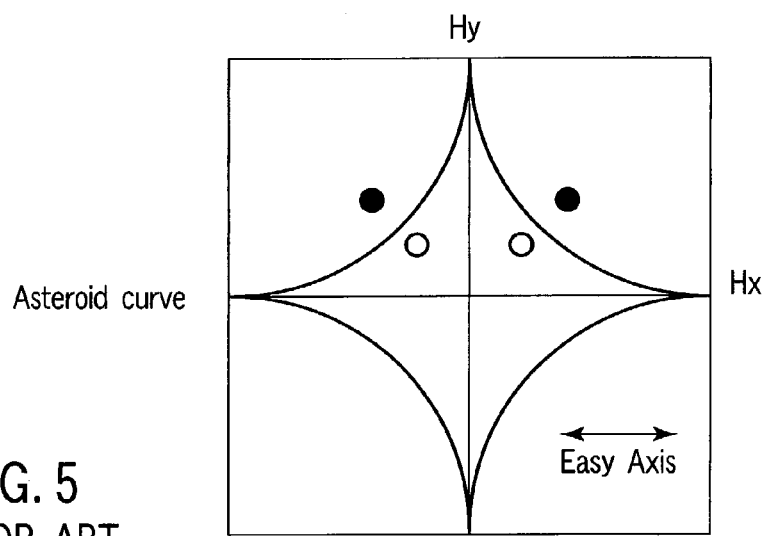
FIG. 5 is a diagram showing an asteroid curve.
Figure 6:
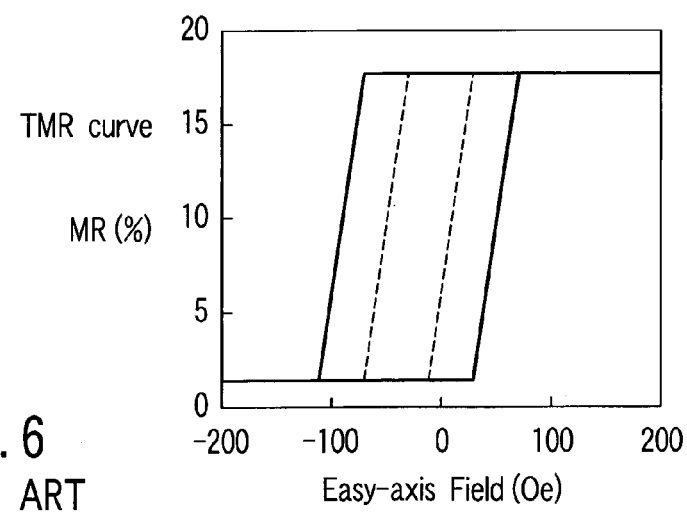
FIG. 6 is a diagram showing an example of shift of the TMR curve.
Figure 18:
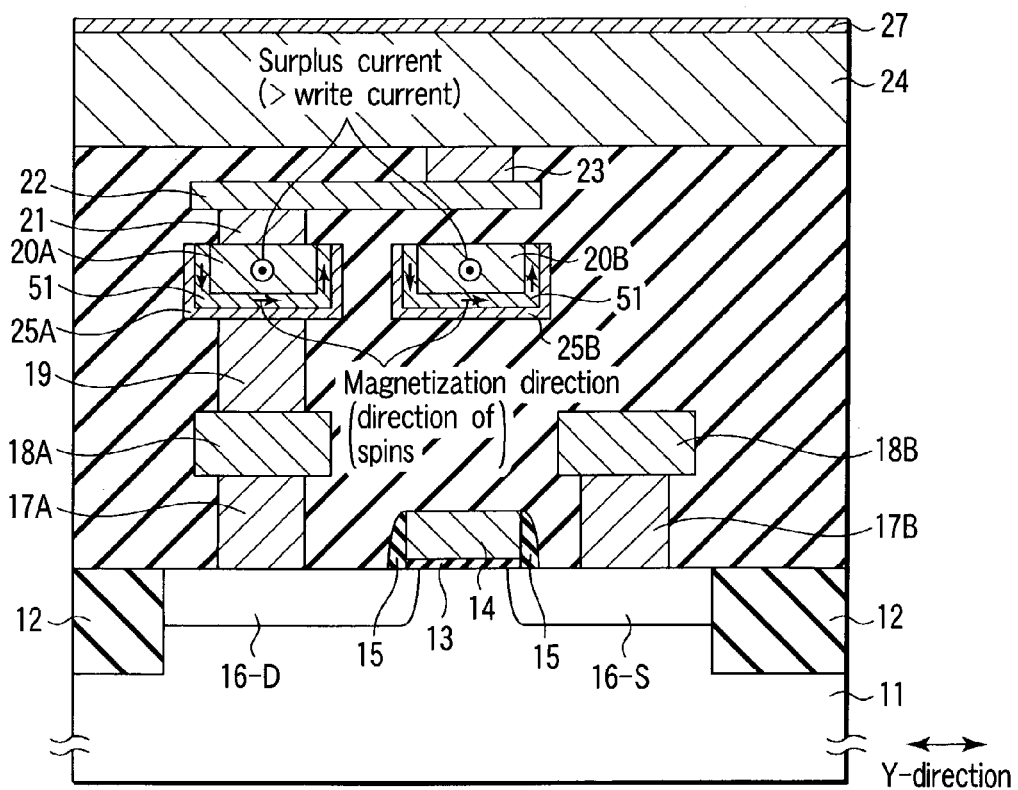
FIG. 18 is a sectional view showing a correction principle of characteristics of the MTJ element.
Figure 19:
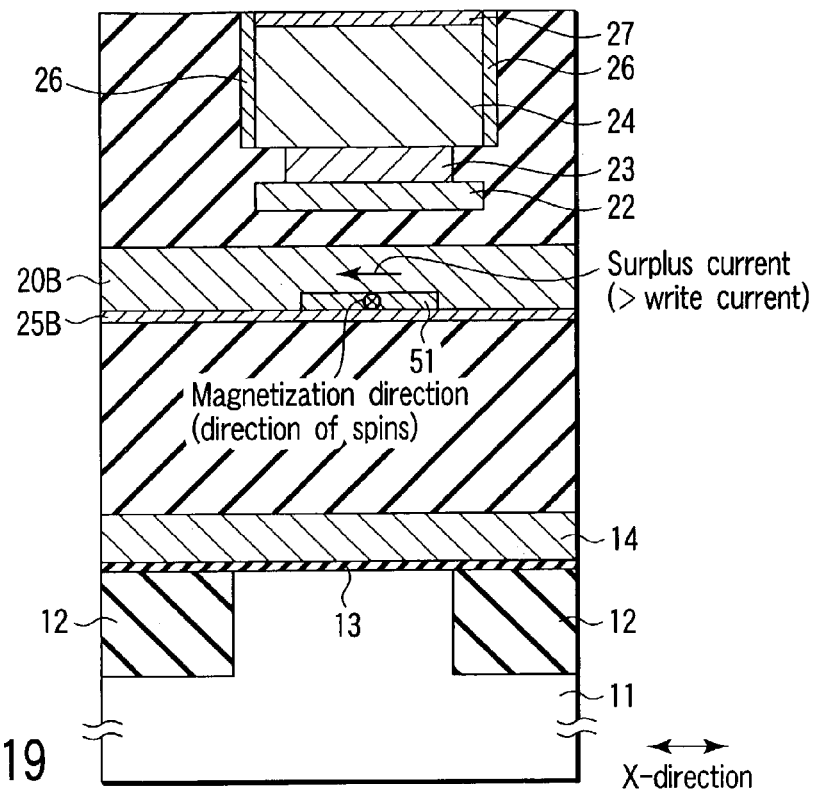
FIG. 19 is a sectional view showing the correction principle of the characteristics of the MTJ element.

As shown in FIG. 6, when the TMR curve of the MTJ element 23 shifts to the left side of an ideal TMR curve (FIG. 4), for example, as shown in FIGS. 18 and 19, a surplus current flowing in one direction is passed through the write word line 20B. As a result, the magnetic fields act on the hard magnetic materials 51, and residual magnetization occurs so that the TMR curve of FIG. 6 is shifted toward the right side.

Figure 7:
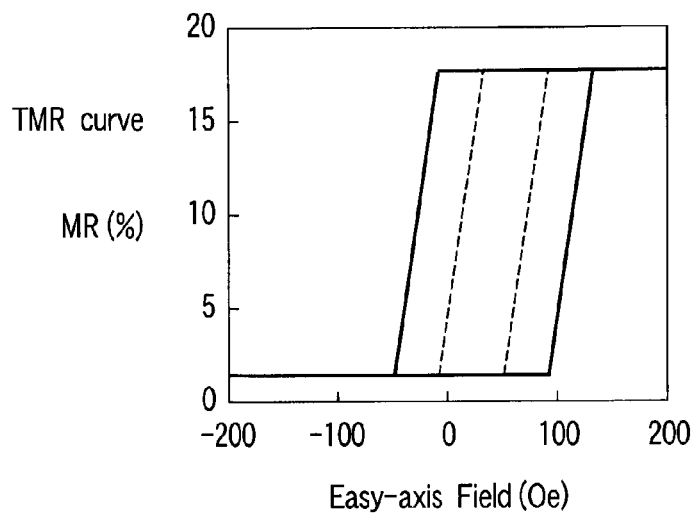
FIG. 7 is a diagram showing an example of shift of the TMR curve.
Figure 20:
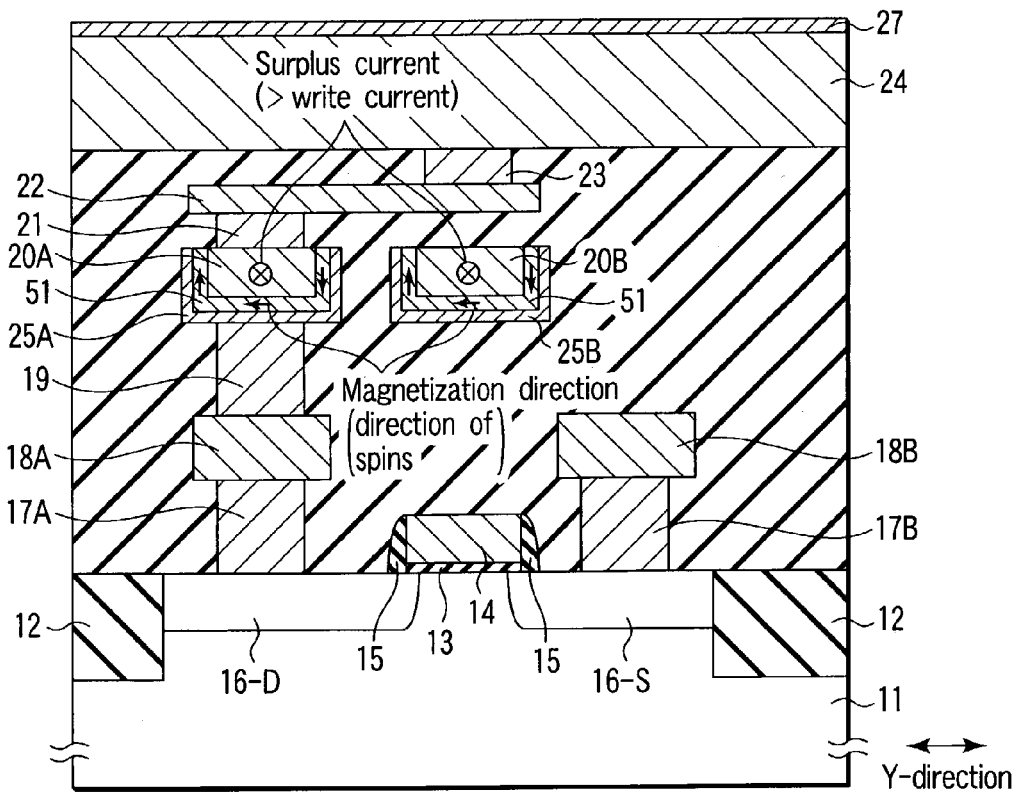
FIG. 20 is a sectional view showing the correction principle of the characteristics of the MTJ element.
Figure 21:
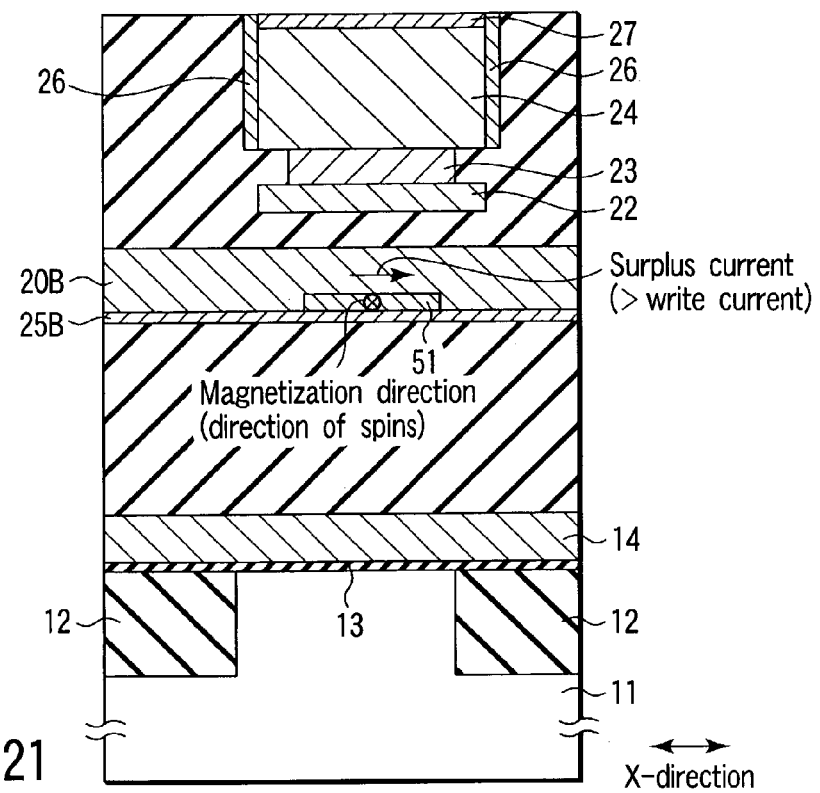
FIG. 21 is a sectional view showing the correction principle of the characteristics of the MTJ element.

Moreover, as shown in FIG. 7, when the TMR curve of the MTJ element 23 shifts to the right side from the ideal TMR curve (FIG. 4), for example, as shown in FIGS. 20 and 21, the surplus current flowing in the other direction is passed through the write word line 20B. As a result, the magnetic fields act on the hard magnetic materials 51, and the residual magnetization occurs so that the TMR curve of FIG. 7 is shifted toward the left side.

Figure 22:
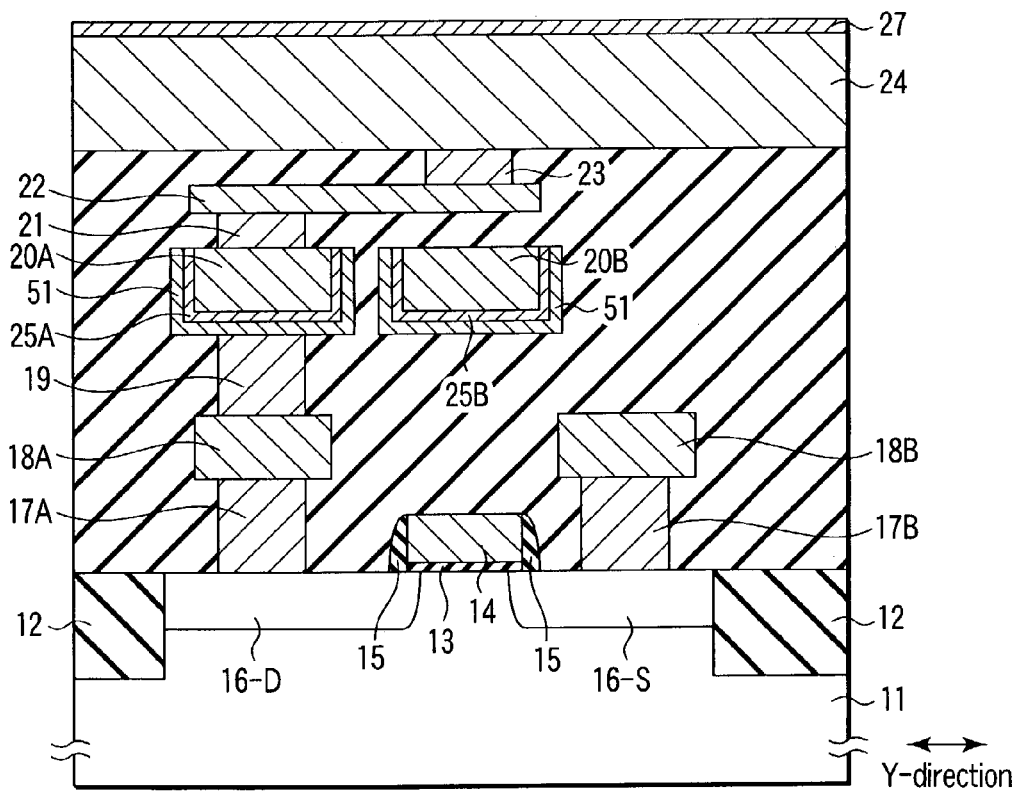
FIG. 22 is a sectional view showing a modification example of Example 1.
Figure 23:
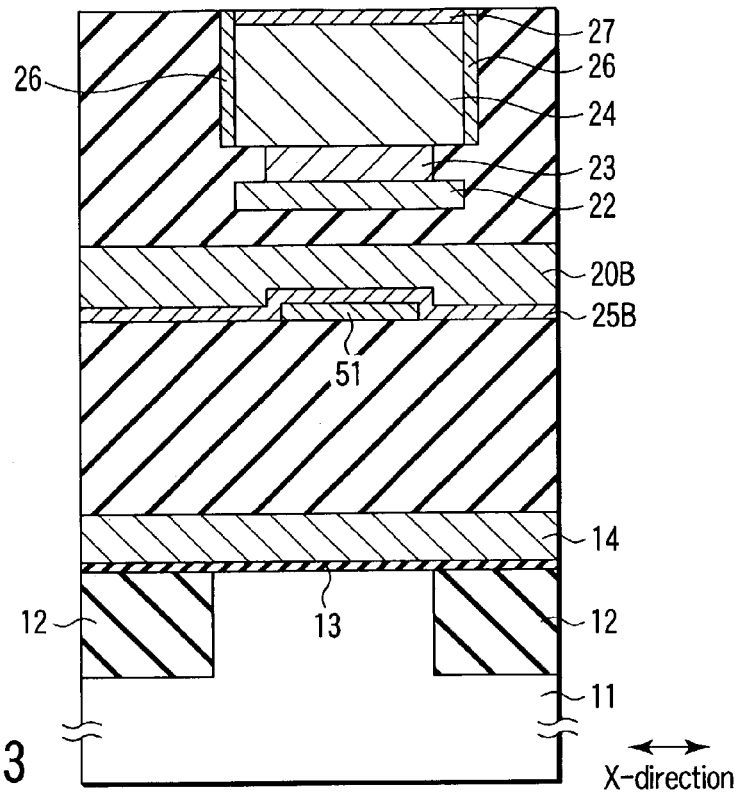
FIG. 23 is a sectional view showing a modification example of Example 1.

FIGS. 22 and 23 show a modification example of the magnetic random access memory according to Example 1.

The characteristic of this modification example lies in a positional relation between the hard magnetic materials 51 and yoke material 25B with which a part of the surface of the write word line 20B is coated.

That is, in the device structures of FIGS. 14 to 17, the hard magnetic materials 51 are disposed between the intermediate layer 20A and yoke material 25A and between the write word line 20B and yoke material 25B, respectively. On the other hand, in the present modification example, the yoke material 25A is disposed between the intermediate layer 20A and hard magnetic material 51, and the yoke material 25B is disposed between the write word line 20B and hard magnetic material 51.

Even in this device structure, the same effect as that of the device structure of FIGS. 14 to 17 can be obtained.

As described above, in the device structure according to Example 1, the hard magnetic material 51 is formed on a part of the surface of the write word line 20B disposed right under the MTJ element 23. Therefore, a deviation of the characteristic (TMR curve) of the MTJ element 23 can be corrected by the unit of the MTJ elements which share one write word line 20B.

It is to be noted that it is preferable to form the write word line 20B, yoke material 25B, and hard magnetic material 51 using the damascene process. Conversely, when the write word line 20B, yoke material 25B, and hard magnetic material 51 are formed using the reactive ion etching (RIE) process, the process becomes very complicated, and this is realistically impossible.

Moreover, the data selection line 24 and yoke materials 26, 27 may be formed using either the damascene process or RIE process.

4. EXAMPLE 2

Figure 24:
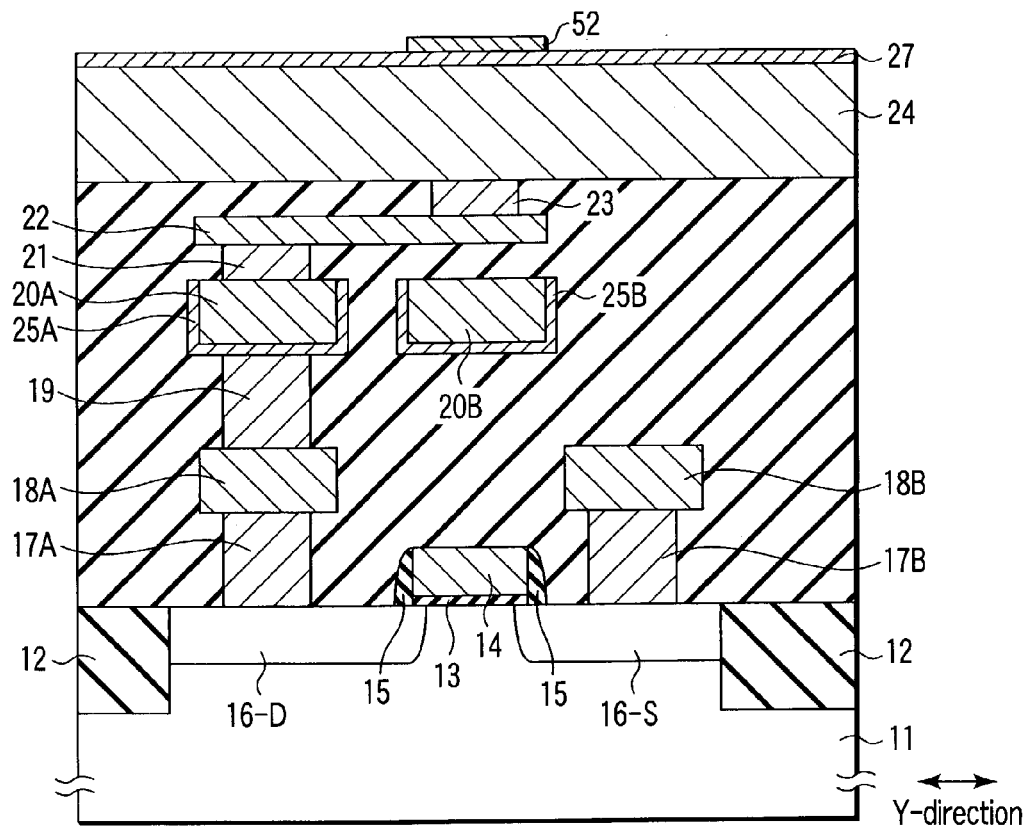
FIG. 24 is a sectional view showing Example 2 of the magnetic random access memory according to the present invention.
Figure 27:
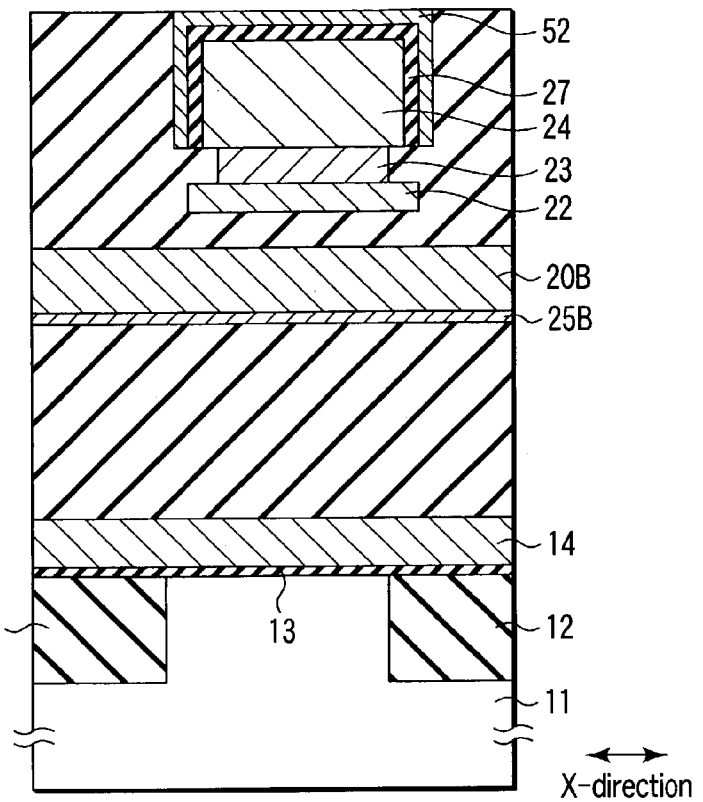
FIG. 27 is a sectional view showing Example 2 of the magnetic random access memory according to the present invention.

FIGS. 24 to 27 show the device structure of the magnetic random access memory according to Example 2 of the present invention. It is to be noted that FIGS. 24 and 26 show the sections in the Y direction, FIG. 25 shows the section of the MTJ element portion of FIG. 24 in the X direction, and FIG. 27 shows the section of the MTJ element portion of FIG. 26 in the X direction. The X direction crosses at right angles to the Y direction.

The characteristic of the device structure of the present example lies in that a part of the surface, concretely, the upper and side surfaces of the data selection line (read/write bit line) 24 disposed right on the MTJ element 23 are coated with hard magnetic materials 52. The hard magnetic materials 52 include the magnetization easy axis in the direction crossing at right angles to the direction in which the data selection line 24 extends.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the present device structure, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking the contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the present device structure, the lower and side surfaces of the intermediate layer 20A and write word line 20B are coated with the materials having the high permeability, that is, the yoke materials 25A, 25B. The yoke materials 25A, 25B for use herein are limited to the materials which have conductivity.

It is to be noted that the magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

It is sufficient to coat the lower and side surfaces of the write word line 20B with the yoke material. Additionally, in actual, the yoke material is also formed on the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the present device structure, the upper and side surfaces of the data selection line 24 are coated with the hard magnetic material (e.g., iron, and the like) 52. When the external magnetic field acts on the hard magnetic material 52, and even after the external magnetic field disappears, the hard magnetic material has the property of having the residual magnetization. In the present invention, the characteristic (TMR curve) of the MTJ element 23 is corrected by this residual magnetization.

The magnetization direction (direction of spins) of the hard magnetic material 52, that is, the correction direction of the characteristic (TMR curve) of the MTJ element 23 is determined by the direction of the current passed through the data selection line 24.

Here, the magnetization direction of the hard magnetic material 52 is determined by the current having the same value as that of the usual write current. Then, every time the write current is passed, the magnetization direction of the hard magnetic material 52 changes, and the hard magnetic material does not have the function of correcting the characteristic of the MTJ element 23. To solve the problem, when the magnetization direction of the hard magnetic material 52 is determined, the surplus current larger than the write current passed at the usual write operation time is passed through the data selection line 24.

Thereby, the magnetization direction of the hard magnetic material 52 is fixed, and the characteristic (TMR curve) of the MTJ element 23 is corrected in the constant direction. Moreover, even when the write current is passed at the usual write operation time, the magnetization direction of the hard magnetic material 52 does not change.

It is to be noted that the magnetization direction of the hard magnetic material 52 is determined, for example, in the test stage after the assembly and before the product shipping. Moreover, the characteristic of the MTJ element 23 in the magnetic random access memory (chip) is inspected, and the characteristic of the MTJ element 23 is corrected by the unit of the data selection line (write bit line) 24.

In the present device structure, the upper and side surfaces of the data selection line 24 are further coated with the material having the high permeability, that is, the yoke material 27. The yoke material 27 is disposed between the data selection line 24 and hard magnetic material 52. The yoke material 27 for use herein can be constituted of the material which has the conductivity as shown in FIGS. 24 and 25, or can also be constituted of the material which has the insulating property as shown in FIGS. 26 and 27.

It is to be noted that, as described above, the magnetic flux has the property of being concentrated on the material which has the high permeability. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which the data of bits can be stored.

FIGS. 28 to 31 schematically show the correction principle of the characteristic of the MTJ element.

Figure 28:
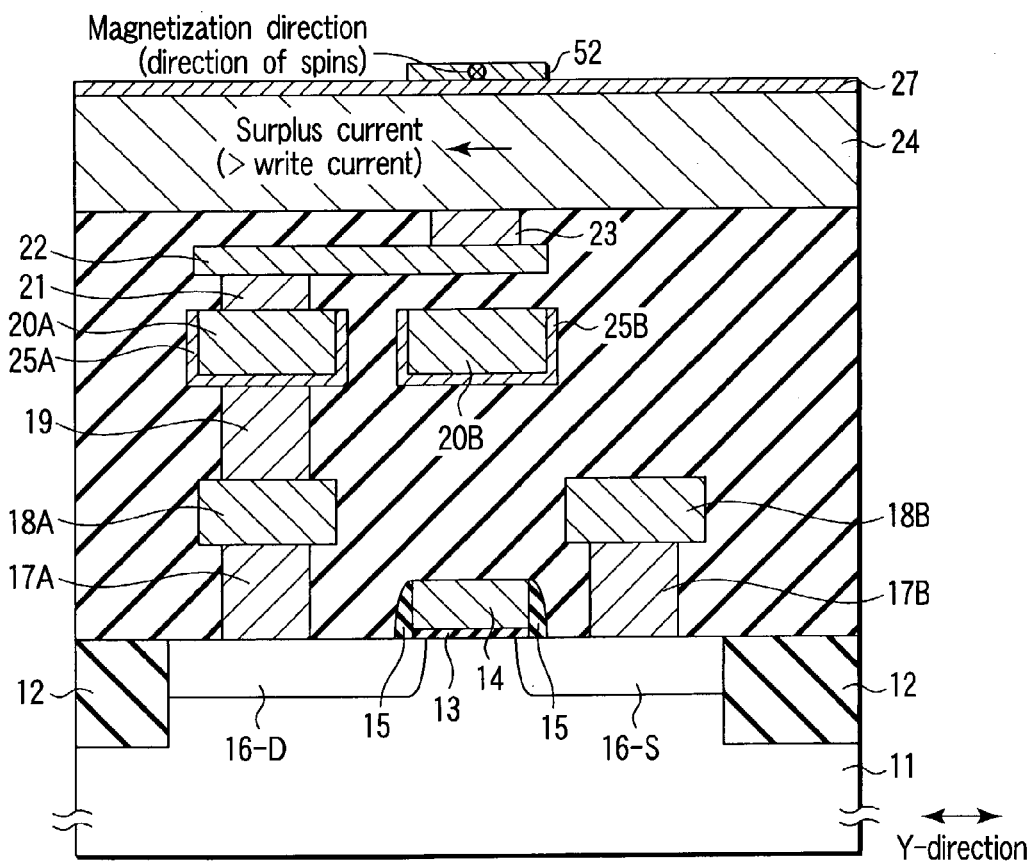
FIG. 28 is a sectional view showing the correction principle of the characteristics of the MTJ element.
Figure 29:
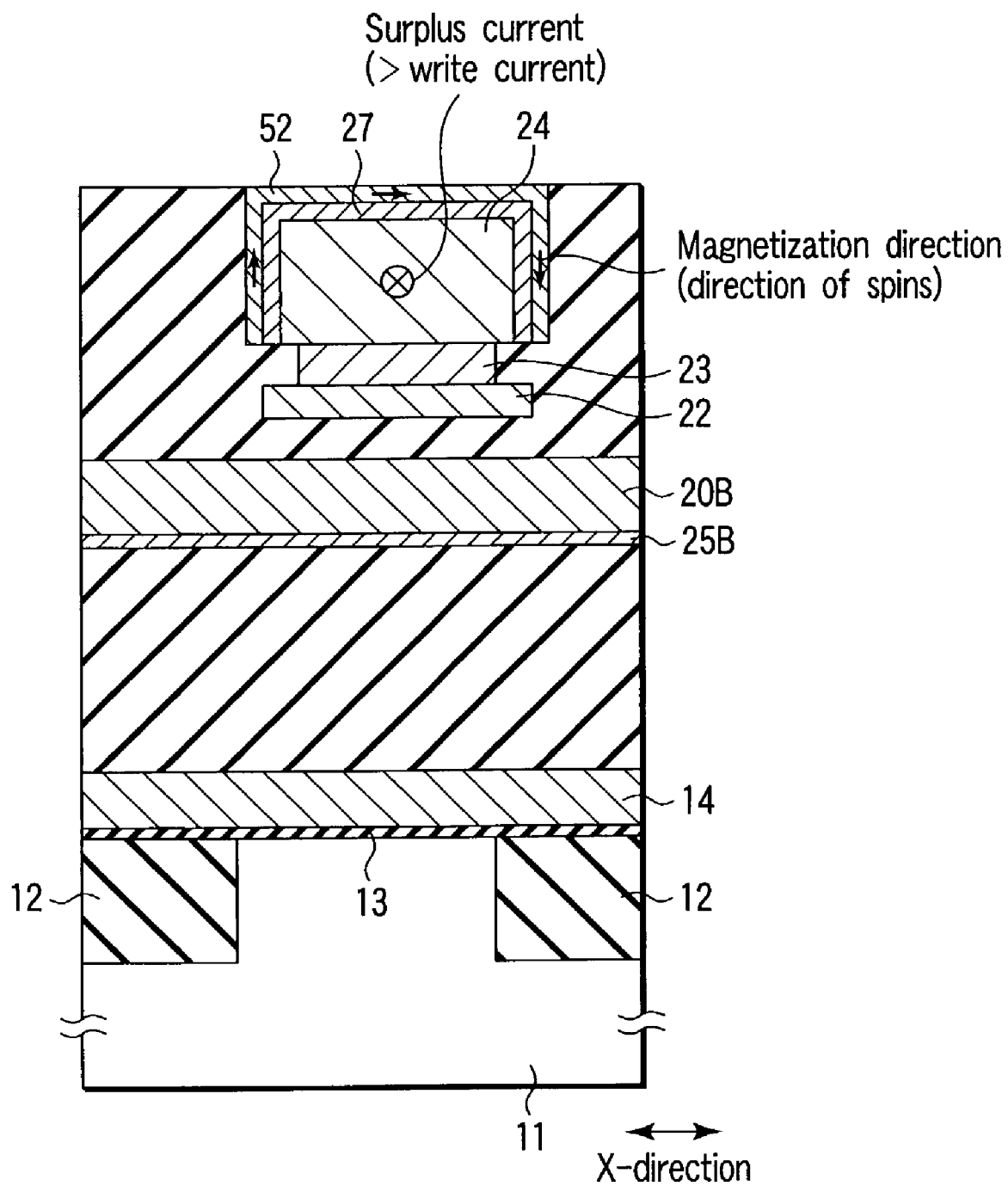
FIG. 29 is a sectional view showing the correction principle of the characteristics of the MTJ element.

As shown in FIG. 6, when the TMR curve of the MTJ element 23 shifts to the left side from the ideal TMR curve (FIG. 4), for example, as shown in FIGS. 28 and 29, the surplus current flowing in one direction is passed through the data selection line 24. As a result, the magnetic field acts on the hard magnetic material 52, and the residual magnetization occurs so that the TMR curve of FIG. 6 is shifted toward the right side.

Figure 30:
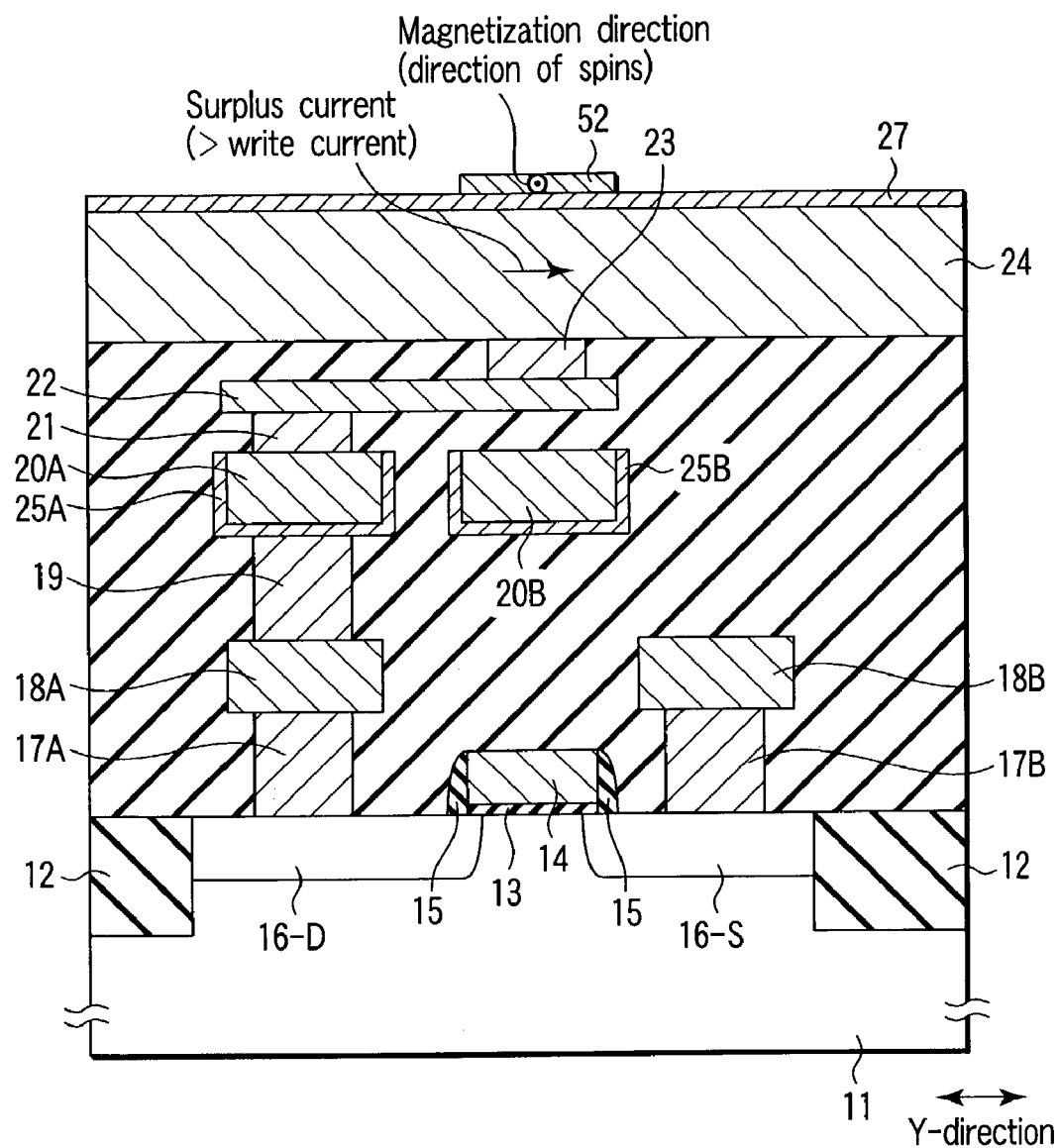
FIG. 30 is a sectional view showing the correction principle of the characteristics of the MTJ element.
Figure 31:
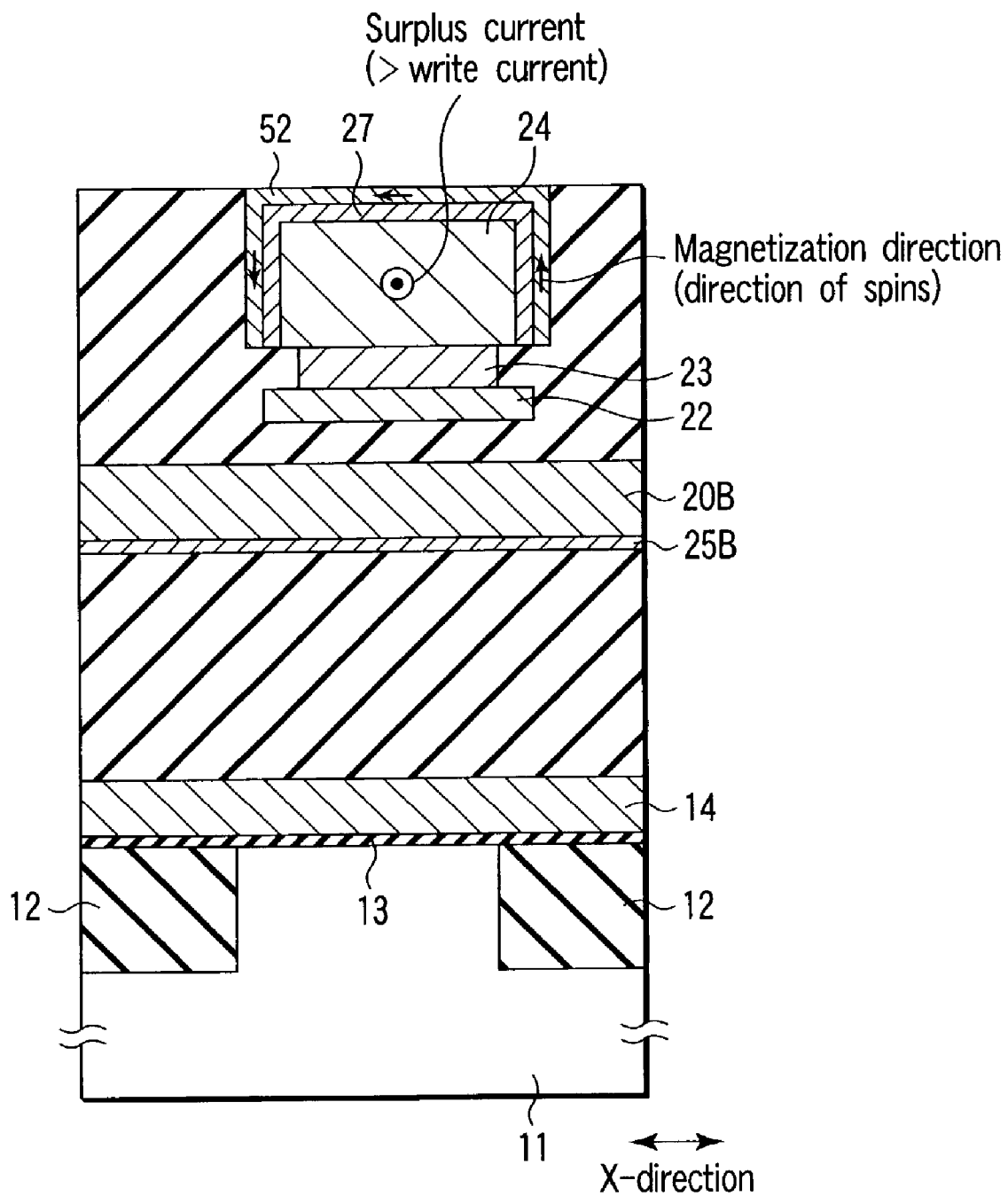
FIG. 31 is a sectional view showing the correction principle of the characteristics of the MTJ element.

Moreover, as shown in FIG. 7, when the TMR curve of the MTJ element 23 shifts to the right side from the ideal TMR curve (FIG. 4), for example, as shown in FIGS. 30 and 31, the surplus current flowing in the other direction is passed through the data selection line 24. As a result, the magnetic field acts on the hard magnetic material 52, and the residual magnetization occurs so that the TMR curve of FIG. 7 is shifted toward the left side.

FIGS. 32 and 33 show the modification example of the magnetic random access memory according to Example 2.

The characteristic of this modification example lies in the positional relation between the hard magnetic material 52 and yoke material 27 with which a part of the surface of the data selection line 24 is coated.

That is, in the device structures of FIGS. 24 to 27, the yoke material 27 is disposed between the data selection line 24 and hard magnetic materials 52. On the other hand, in the present modification example, the hard magnetic material 52 is disposed between the data selection line 24 and yoke material 27.

Even in this device structure, the same effect as that of the device structure of FIGS. 24 to 27 can be obtained.

As described above, in the device structure according to Example 2, the hard magnetic material 52 is formed on a part of the surface of the data selection line 24 disposed right on the MTJ element 23. Therefore, the deviation of the characteristic (TMR curve) of the MTJ element 23 can be corrected by a unit of the MTJ elements which share one data selection line 24.

It is to be noted that it is preferable to form the write word line 20B and yoke material 25B using the damascene process. Moreover, the data selection line 24, yoke material 27, and hard magnetic material 52 may be formed using either the damascene process or RIE process.

5. EXAMPLE 3

Figure 36:
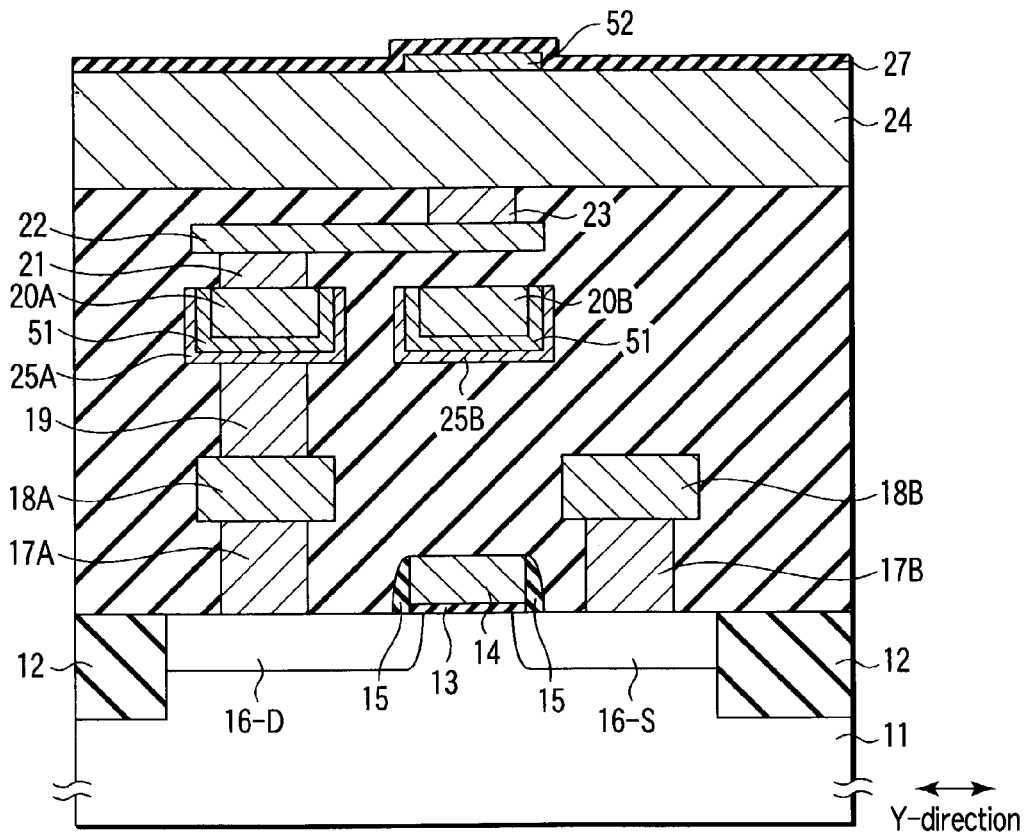
FIG. 36 is a sectional view showing Example 3 of the magnetic random access memory according to the present invention.
Figure 37:
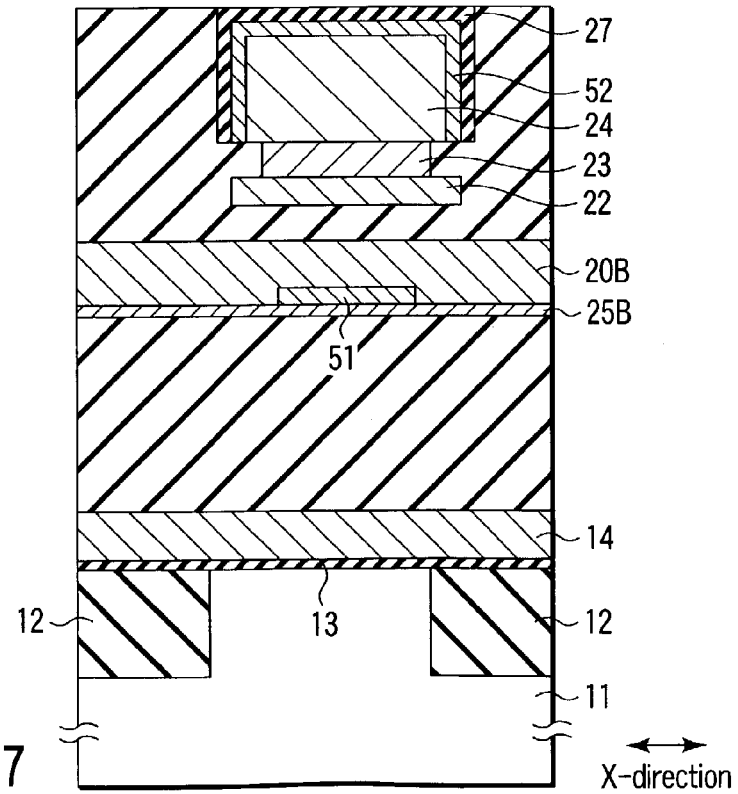
FIG. 37 is a sectional view showing Example 3 of the magnetic random access memory according to the present invention.

FIGS. 34 to 37 show the device structure of the magnetic random access memory according to Example 3 of the present invention. It is to be noted that FIGS. 34 and 36 show the sections in the Y direction, FIG. 35 shows the section of the MTJ element portion of FIG. 34 in the X direction, and FIG. 37 shows the section of the MTJ element portion of FIG. 36 in the X direction. The X direction crosses at right angles to the Y direction.

The characteristic of the device structure of the present example lies in that a part of the surface, concretely, the lower and side surfaces of the write word line 20B disposed right under the MTJ element 23 are coated with the hard magnetic material 51. The hard magnetic material 51 includes the magnetization easy axis in the direction crossing at right angles to the direction in which the write word line 20B extends.

Moreover, the characteristic of the device structure of the present example lies in that a part of the surface, concretely, the upper and side surfaces of the data selection line (read/write bit line) 24 disposed right on the MTJ element 23 are coated with the hard magnetic material 52. The hard magnetic material 52 includes the magnetization easy axis in the direction crossing at right angles to the direction in which the data selection line 24 extends.

In the semiconductor substrate (e.g., the p-type silicon substrate, p-type well region, and the like) 11, the element isolation insulating layer 12 including the shallow trench isolation (STI) structure is formed. The region surrounded by the element isolation insulating layer 12 is the element region in which the read selection switch is formed.

In the present device structure, the read selection switch is constituted of the MOS transistor (n-channel type MOS transistor). On the semiconductor substrate 11, the gate insulating layer 13, gate electrode 14, and side wall insulating layer 15 are formed. The gate electrode 14 extends in the X direction, and functions as the read word line for selecting the read cell (MTJ element) at the read operation time.

In the semiconductor substrate 11, the source region (e.g., the n-type diffused layer) 16-S and drain region (e.g., n-type diffused layer) 16-D are formed. The gate electrode (read word line) 14 is disposed in the channel region between the source region 16-S and drain region 16-D.

One of the metal layers constituting the first metal wiring layer functions as the intermediate layer 18A for vertically stacking the contact plugs, and the other layer functions as the source line 18B.

The intermediate layer 18A is electrically connected to the drain region 16-D of the read selection switch (MOS transistor) via the contact plug 17A. The source line 18B is electrically connected to the source region 16-S of the read selection switch via the contact plug 17B. The source line 18B extends in the X direction, for example, in the same manner as the gate electrode (read word line) 14.

One of the metal layers constituting the second metal wiring layer functions as the intermediate layer 20A for vertically stacking contact plugs, and the other layer functions as the write word line 20B. The intermediate layer 20A is electrically connected to the intermediate layer 18A via the contact plug 19. The write word line 20B extends, for example, in the X direction in the same manner as the gate electrode (read word line) 14.

In the present device structure, the lower and side surfaces of the intermediate layer 20A and write word line 20B are coated with the hard magnetic materials (e.g., iron, and the like) 51. When the external magnetic field acts on the hard magnetic materials 51, and even after the external magnetic field disappears, the hard magnetic materials have the properties of having the residual magnetization. In the present invention, the characteristic (TMR curve) of the MTJ element 23 is corrected by this residual magnetization.

The magnetization direction (direction of spins) of the hard magnetic material 51, that is, the correction direction of the characteristic (TMR curve) of the MTJ element 23 is determined by the direction of the current passed through the write word line 20B.

Here, the magnetization direction of the hard magnetic material 51 is determined by the current having the same value as that of the usual write current. Then, every time the write current is passed, the magnetization direction of the hard magnetic material 51 changes, and the hard magnetic material does not have the function of correcting the characteristic of the MTJ element 23. To solve the problem, when the magnetization direction of the hard magnetic material 51 is determined, the surplus current larger than the write current passed at the usual write operation time is passed through the write word line 20B.

Thereby, the magnetization direction of the hard magnetic material 51 is fixed, and the characteristic (TMR curve) of the MTJ element 23 is corrected in the constant direction. Moreover, even when the write current is passed at the usual write operation time, the magnetization direction of the hard magnetic material 51 does not change.

It is to be noted that the magnetization direction of the hard magnetic material 51 is determined, for example, in the test stage after the assembly and before the product shipping. Moreover, the characteristic of the MTJ element 23 in the magnetic random access memory (chip) is inspected, and the characteristic of the MTJ element 23 is corrected by the unit of the write word line 20B.

In the present device structure, the lower and side surfaces of the intermediate layer 20A and write word line 20B are further coated with the materials having the high permeability, that is, the yoke materials 25A, 25B. The hard magnetic materials 51 are disposed between the intermediate layer 20A and yoke material 25A and between the write word line 20B and yoke material 25B, respectively. The yoke materials 25A, 25B for use herein are limited to the materials which have conductivity.

It is to be noted that the magnetic flux has the property of being concentrated on the material which has the high permeability. Therefore, when the material having the high permeability is used as the tractor of the line of magnetic force, the magnetic field Hy generated by the write current flowing through the write word line 20B can be concentrated on the MTJ element 23 with good efficiency at the write operation time.

It is sufficient to coat the lower and side surfaces of the write word line 20B with the hard magnetic materials and yoke materials. Additionally, in actual, the hard magnetic materials and yoke materials are also formed in the lower and side surfaces of the intermediate layer 20A. This is because the intermediate layer 20A and write word line 20B, which are the second metal wiring layer, are simultaneously formed.

One of the metal layers constituting the third metal wiring layer functions as the lower electrode 22 of the MTJ element 23. The lower electrode 22 is electrically connected to the intermediate layer 20A via the contact plug 21. The MTJ element 23 is mounted on the lower electrode 22. Here, the MTJ element 23 is disposed right on the write word line 20B, and formed in the rectangular shape long in the X direction (magnetization easy axis corresponds to the X direction).

One of the metal layers constituting the fourth metal wiring layer functions as the data selection line (read/write bit line) 24. The data selection line 24 is electrically connected to the MTJ element 23, and extends in the Y direction.

In the present device structure, the upper and side surfaces of the data selection line 24 are coated with the hard magnetic material (e.g., iron, and the like) 52. As described above, when the external magnetic field acts on the hard magnetic material 52, and even after the external magnetic field disappears, the hard magnetic material has the property of having the residual magnetization. In the present invention, the characteristic (TMR curve) of the MTJ element 23 is corrected by this residual magnetization.

The magnetization direction (direction of spins) of the hard magnetic material 52, that is, the correction direction of the characteristic (TMR curve) of the MTJ element 23 is determined by the direction of the current passed through the data selection line 24.

Here, the magnetization direction of the hard magnetic material 52 is determined by the current having the same value as that of the usual write current. Then, every time the write current is passed, the magnetization direction of the hard magnetic material 52 changes, and the hard magnetic material does not have the function of correcting the characteristic of the MTJ element 23. To solve the problem, when the magnetization direction of the hard magnetic material 52 is determined, the surplus current larger than the write current passed at the usual write operation time is passed through the data selection line 24.

Thereby, the magnetization direction of the hard magnetic material 52 is fixed, and the characteristic (TMR curve) of the MTJ element 23 is corrected in the constant direction. Moreover, even when the write current is passed at the usual write operation time, the magnetization direction of the hard magnetic material 52 does not change.

It is to be noted that the magnetization direction of the hard magnetic material 52 is determined, for example, in the test stage after the assembly and before the product shipping. Moreover, the characteristic of the MTJ element 23 in the magnetic random access memory (chip) is inspected, and the characteristic of the MTJ element 23 is corrected by the unit of the data selection line (write bit line) 24.

In the present device structure, the upper and side surfaces of the data selection line 24 are further coated with the material having the high permeability, that is, the yoke material 27. The yoke material 27 is disposed between the data selection line 24 and hard magnetic material 52. The yoke material 27 for use herein can be constituted of the material which has the conductivity as shown in FIGS. 34 and 35, or can also be constituted of the material which has the insulating property as shown in FIGS. 36 and 37.

It is to be noted that, as described above, the magnetic flux has the property of being concentrated on the material which has the high permeability. Therefore, when the material having the high permeability is used as the tractor of the line of magnetic force, the magnetic field Hx generated by the write current flowing through the data selection line 24 can be concentrated on the MTJ element 23 with good efficiency at the write operation time.

The structure of the MTJ element 23 is not especially limited. The structure shown in FIG. 1 or another structure may also be used. Moreover, the MTJ element 23 may also be of the multi-valued storage type in which the data of bits can be stored.

As described above, in the device structure according to Example 3, the hard magnetic material 51 is formed on a part of the surface of the write word line 20B disposed right under the MTJ element 23. Moreover, the hard magnetic material 52 is formed on a part of the surface of the data selection line 24 disposed right on the MTJ element 23. Therefore, the deviation of the characteristic (TMR curve) of the MTJ element 23 can be corrected by the unit of MTJ elements which share one write word line 20B or one data selection line 24.

It is to be noted that it is preferable to form the write word line 20B, yoke material 25B, and hard magnetic material 51 using the damascene process. Conversely, when the write word line 20B, yoke material 25B, and hard magnetic material 51 are formed using the reactive ion etching (RIE) process, the process becomes very complicated, and this is realistically impossible.

Moreover, the data selection line 24, yoke material 27, and hard magnetic material 52 may be formed using either the damascene process or RIE process.

6. MEMORY CELL ARRAY STRUCTURE

Examples of a memory cell array structure (circuit structure) realized by the device structures according to Reference Examples 1, 2, and Examples 1 to 3 will be described.

FIG. 38 shows a main part of the memory cell array structure of the magnetic random access memory.

In the cell array structure, it is assumed that the magnetization easy axis of the MTJ element is directed in the Y direction, and the direction of the write current flowing through the write word line changes in accordance with write data.

Control signals $\phi 1$, $\phi 31$, $\phi 32$, $\phi 33$ control and turn on/off N-channel MOS transistors QN1, QN31, QN32, QN33 to determine whether or not the currents are passed through data selection lines (read/write bit lines) BL1, BL2, BL3. One end (the side of the N-channel MOS transistor QN1) of the data selection lines BL1, BL2, BL3 is connected to a power supply 40 for the write current. The power supply 40 for the write current sets a potential of one end of the data selection lines BL1, BL2, BL3 to Vy.

The N-channel MOS transistors QN31, QN32, QN33 are connected between the other ends of the data selection lines BL1, BL2, BL3 and ground points Vss.

At the write operation time, the control signal $\phi 1$ turns to an "H" level, and one of the control signals $\phi 31$, $\phi 32$, $\phi 33$ turns to the "H" level. For example, when the data is written into the MTJ element of a memory cell MC1, as shown in a timing chart of FIG. 48, since the control signals $\phi 1$, $\phi 31$ turn to the "H" level, the current flows through the data selection line BL1. At this time, control signals $\phi 41$, $\phi 42$, $\phi 43$ turn to an "L" level.

Moreover, V×1 indicates a power supply potential for "1"-write, and V×2 indicates a power supply potential for "0"-write.

Figure 39:
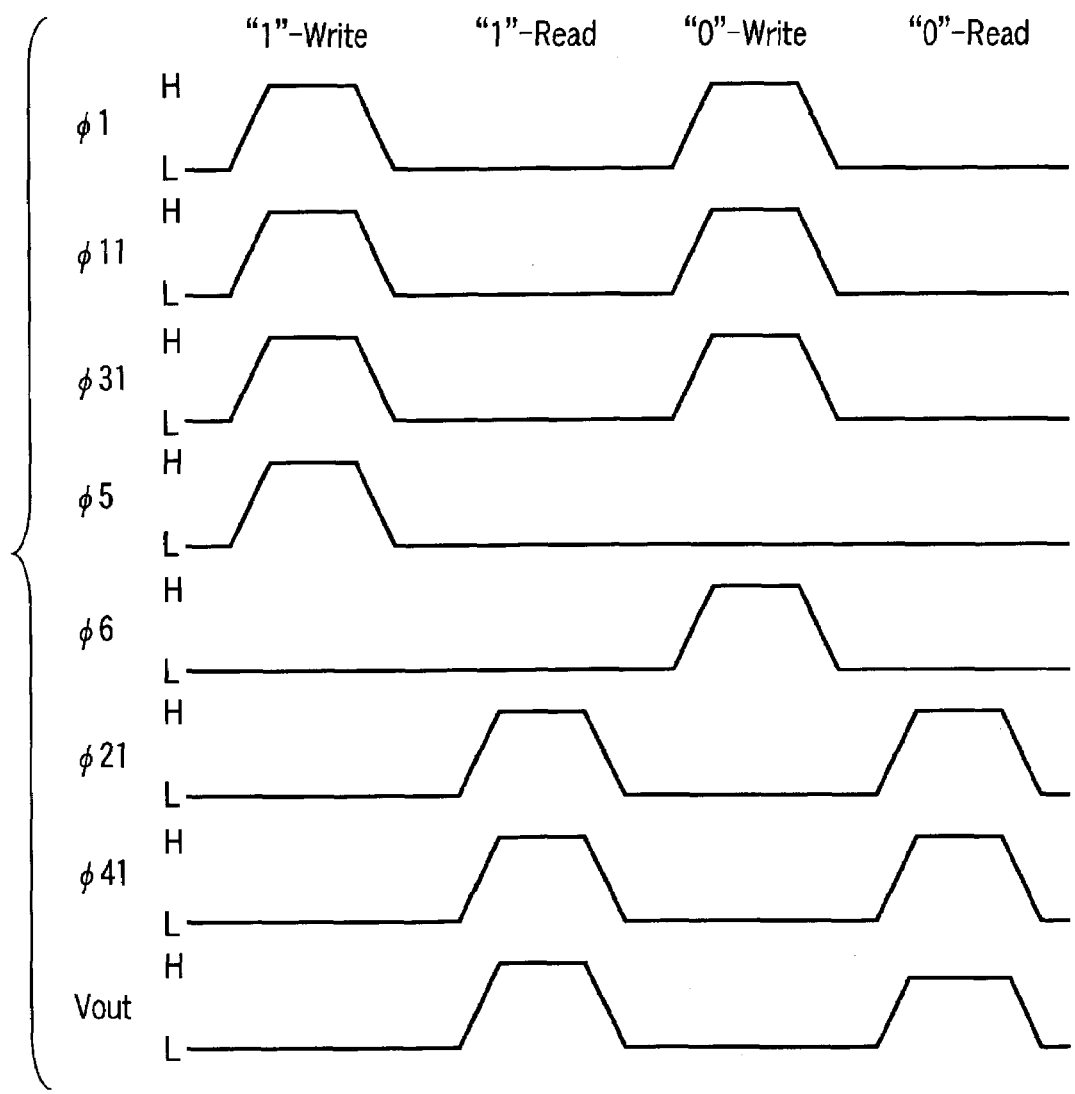
FIG. 39 is a diagram showing an operation waveform of the cell array of FIG. 38.

For example, at a "1"-write time, as shown in FIG. 39, the control signals $\phi 5$, $\phi 11$ turn to the "H" level. At this time, the control signals $\phi 6$, $\phi 12$ turn to the "L" level. For this, the current flows through a write word line WWL1 to the right from the left (to the ground point from a power supply 41 for the write current). Therefore, "1"-data is written in the MTJ element of the memory cell MC1 disposed in the intersection of the data selection line BL1 and write word line WWL1.

Moreover, at the "0"-write time, as shown in FIG. 39, the control signals $\phi 5$, $\phi 11$ turn to the "H" level. At this time, the control signals $\phi 5$, $\phi 12$ turn to the "L" level. For this, the current flows through the write word line WWL1 to the left from the right (to a power supply 42 for the write current from the ground point Vss). Therefore, "0"-data is written in the MTJ element of the memory cell MC1 disposed in the intersection of the data selection line BL1 and write word line WWL1.

In this manner, at the write operation time, the control signal $\phi 1$ is used to supply a driving current to all the data selection lines, and the control signals $\phi 31$, $\phi 32$, $\phi 33$ are used to select the data selection line through which the driving current is passed. It is to be noted that in the present example the direction of the driving current flowing through the data selection line is constant. The control signals $\phi 5$, $\phi 6$ are used to control the direction of the current flowing through the write word line (corresponding to the write data). The control signals $\phi 11$, $\phi 12$ are used to select the write word line through which the driving current is passed.

In the present example, to simplify the description, a 3×2 memory cell array is assumed. The memory cells (MTJ elements) are disposed in the intersections of the write word lines WWL1, WWL2, and data selection lines BL1, BL2, BL3. Here, to read the data stored in the memory cell MC1, the control signals $\phi 21$, $\phi 22$, $\phi 41$, $\phi 42$, $\phi 43$ are controlled as follows.

That is, at the read operation time, the control signal $\phi 21$ given to a read word line RWL1 is set to the "H" level, and the N-channel MOS transistor connected to the read word line RWL1 is brought in an on state. At this time, the control signal $\phi 22$ given to another read word line RWL2 indicates the "L" level.

Moreover, when the control signal $\phi 41$ is set to the "H" level, and the other control signals $\phi 42$, $\phi 43$ are set to the "L" level, the driving current flows toward the ground point from a power supply 43 for a read current via the memory cell MC1 (N-channel MOS transistor and MTJ element), data selection line BL1, N-channel MOS transistor QN41, and detection resistance Rs.

Therefore, detection voltages Vo are generated in the opposite ends of the detection resistance Rs in accordance with a data value of the memory cell MC1. For example, when the detection voltages Vo are detected by a sense amplifier S/A, the data of the memory cell (MTJ element) can be read.

7. MANUFACTURING METHOD

Next, a manufacturing method of the device structure according to Example 3 will be described among the device structures according to Reference Examples 1, 2 and Examples 1 to 3.

Figure 40:
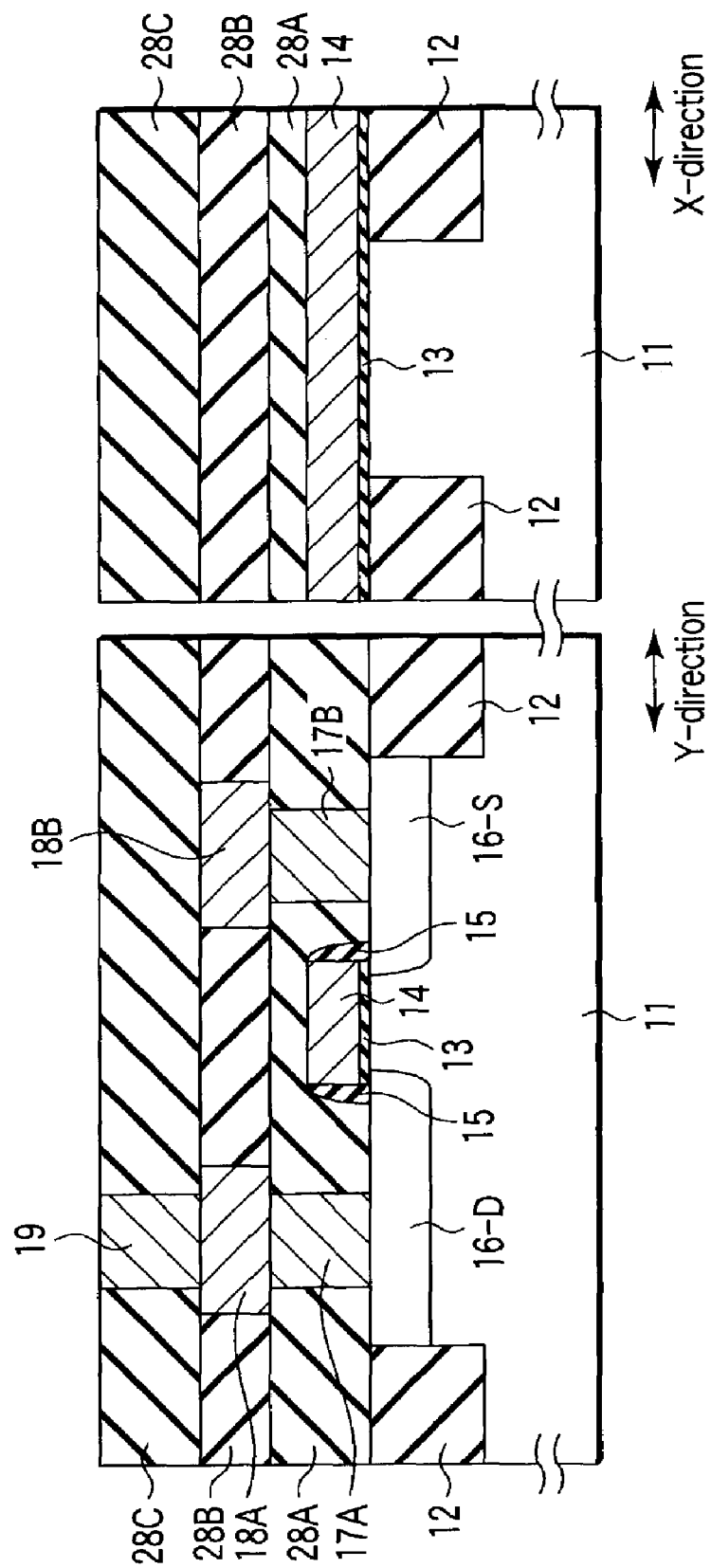
FIG. 40 is a sectional view showing one step of a manufacturing method of a device structure of Example 3.

First, as shown in FIG. 40, known methods such as a photo engraving process (PEP) method, chemical vapor deposition (CVD) method, and chemical mechanical polishing (CMP) methods are used to form the element isolation insulating layer 12 including an STI structure in the semiconductor substrate 11.

Moreover, the MOS transistor is formed as the read selection switch in the element region surrounded by the element isolation insulating layer 12.

The MOS transistor can easily be formed by forming the gate insulating layer 13 and gate electrode (read word line) 14 by the CVD, PEP, and reactive ion etching (RIE) methods, and subsequently forming the source region 16-S and drain region 16-D by an ion implantation method. It is to be noted that the side wall insulating layer 15 may also be formed on the side wall portion of the gate electrode 14 by the CVD and RIE methods.

Thereafter, an insulating layer 28A with which the MOS transistor is completely coated is formed by the CVD method. Moreover, the CMP method is used to flatten the surface of the insulating layer 28A. The PEP and RIE methods are used to form a contact hole reaching the source diffused layer 16-S and drain diffused layer 16-D of the MOS transistor in the insulating layer 28A.

On the insulating layer 28A, a conductive material (e.g., an impurity-containing conductive polysilicon film, metal film, and the like) with which the contact hole is completely filled is formed. Subsequently, the conductive material is polished by the CMP method to form the contact plugs 17A, 17B.

The CVD method is used to form an insulating layer 28B on the insulating layer 28A. The PEP and RIE methods are used to form a wiring trench in the insulating layer 28B. A sputter method is used to form the conductive material (e.g., the metal film such as aluminum and copper) with which the wiring trench is completely filled on the insulating layer 28B. Thereafter, the conductive material is polished by the CMP method to form the intermediate layer 18A and source line 18B.

Subsequently, the CVD method is used to form an insulating layer 28C on the insulating layer 28B. The PEP and RIE methods are used to form a via hole in the insulating layer 28C. The sputter method is used to form the conductive material (e.g., the metal film such as aluminum and copper) with which the via hole is completely filled on the insulating layer 28C. Thereafter, the conductive material is polished by the CMP method to form the via plug 19.

Figure 41:
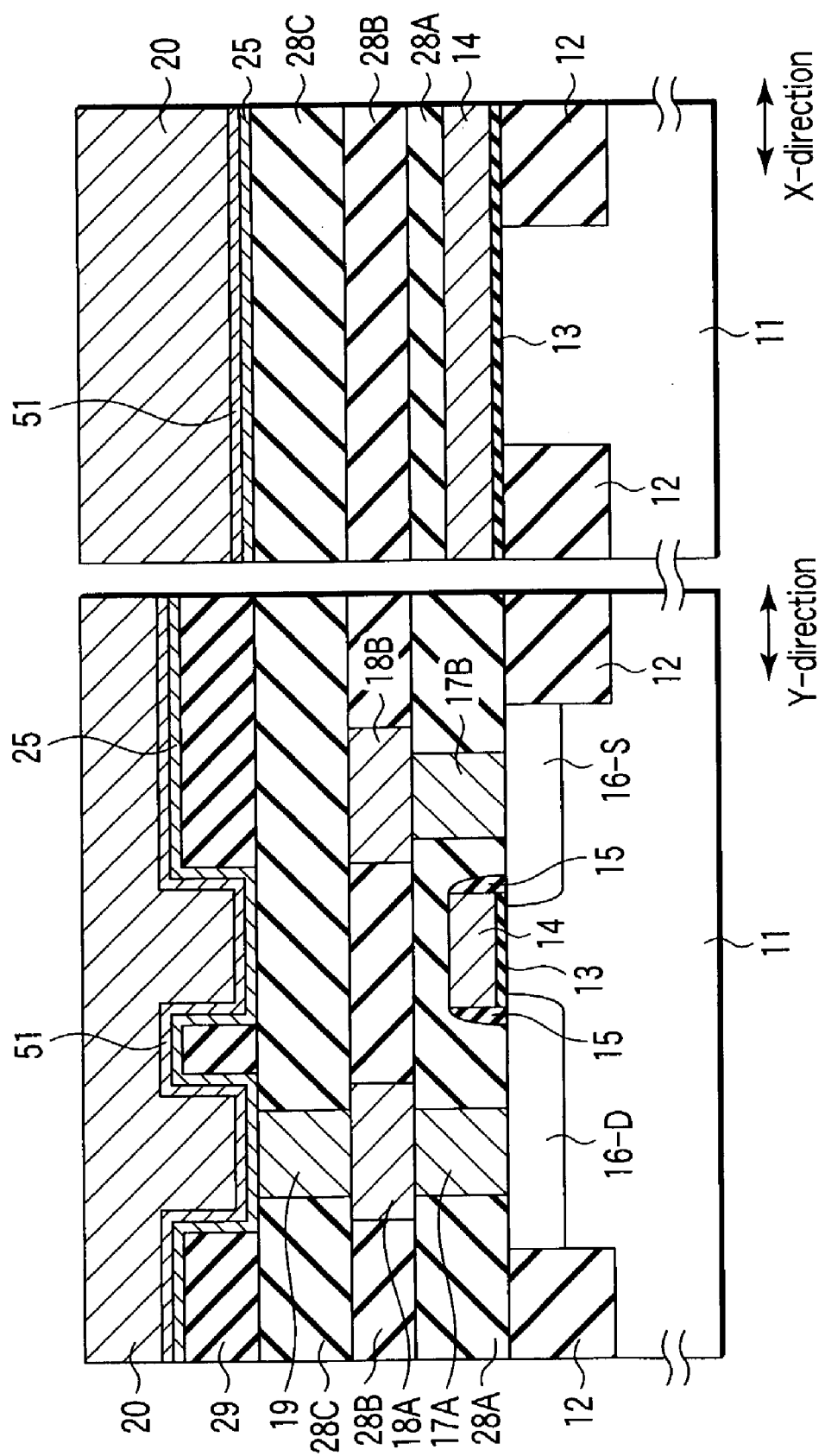
FIG. 41 is a sectional view showing one step of the manufacturing method of the device structure of Example 3.

Next, as shown in FIG. 41, the CVD method is used to form an insulating layer 29 on the insulating layer 28C. The PEP and RIE methods are used to form the wiring trench in the insulating layer 29. The sputter method is used to form the yoke material (e.g., NiFe) 25 having the high permeability in a thickness of about 20 nm on the insulating layer 29 and in the wiring trench. Moreover, the sputter method is used to form the hard magnetic material (e.g., Fe) 51 in a thickness of about 20 nm on the insulating layer 29 and in the wiring trench. Subsequently, the sputter method is used to form a conductive material (e.g., the metal film such as aluminum and copper) 20 with which the wiring trench is completely filled. Thereafter, when the conductive material 20 is polished by the CMP method, the intermediate layer 20A and write word line 20B are formed (see FIG. 42).

Figure 42:
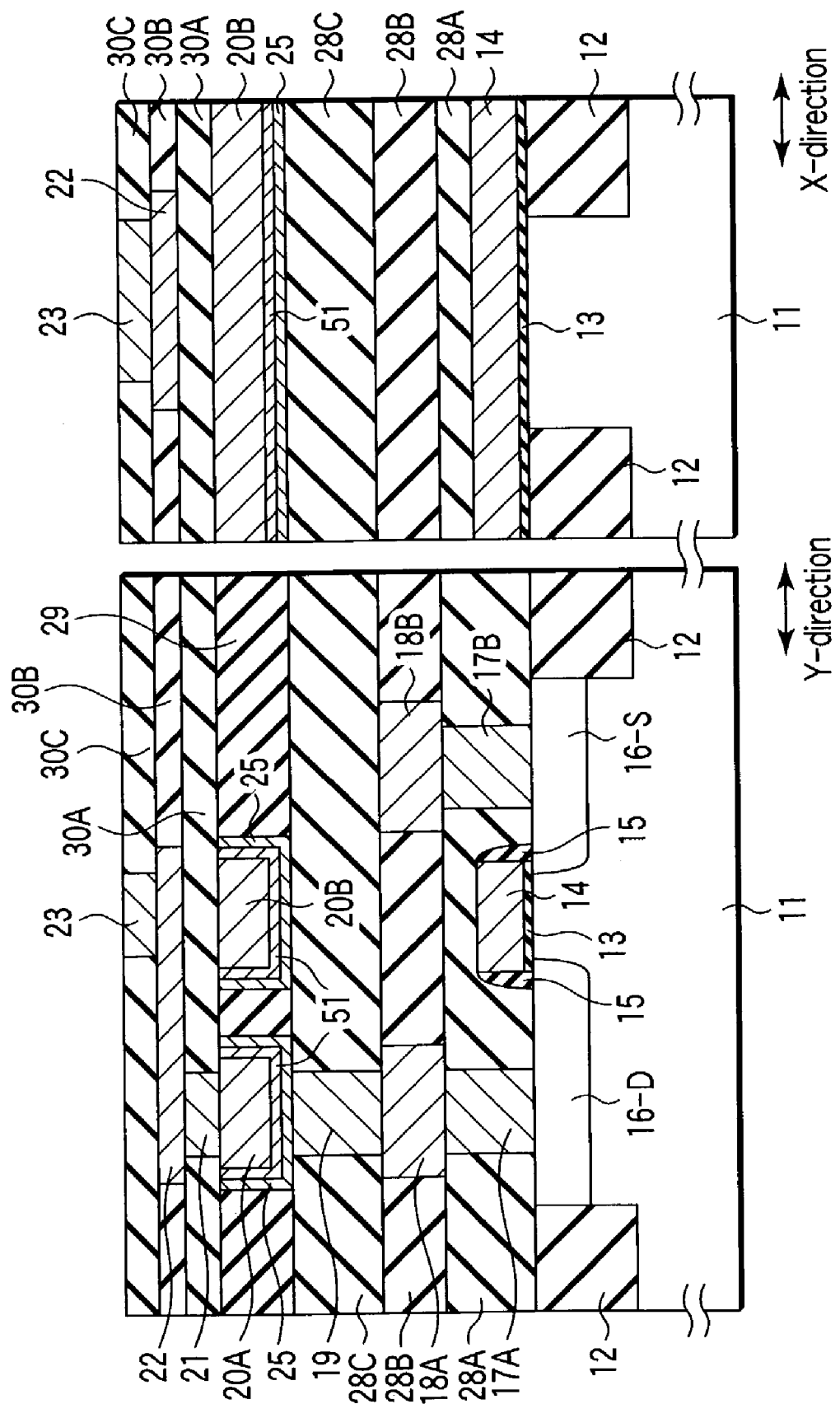
FIG. 42 is a sectional view showing one step of the manufacturing method of the device structure of Example 3.

Next, as shown in FIG. 42, the CVD method is used to form an insulating layer 30A on the insulating layer 29. The PEP and RIE methods are used to form the via hole in the insulating layer 30A. By the CVD method, the conductive material (e.g., the metal film such as tungsten) with which the via hole is completely filled is formed on the insulating layer 30A. Thereafter, the conductive material is polished by the CMP method to form the via plug 21.

Here, the thickness of the insulating layer 30A (or the height of the via plug 21) determines a distance between the write word line 20B and MTJ element 23. The intensity of the magnetic field decreases in inverse proportion to the distance, therefore the MTJ element is brought as close as possible toward the write word line 20B, and the data is preferably rewritten by a small driving current. Therefore, the thickness of the insulating layer 30A is set to be as thin as possible.

The CVD method is used to form an insulating layer 30B on the insulating layer 30A. The PEP and RIE methods are used to form the wiring trench in the insulating layer 30B. By the sputter method, on the insulating layer 30B, the conductive material (e.g., the metal film such as tantalum) with which the wiring trench is completely filled is formed. Thereafter, the conductive material is polished by the CMP to form local interconnect lines (lower electrodes of the MTJ element) 22.

The CVD method is used to successively form, for example, NiFe (about 5 nm), IrMn (about 12 nm), CoFe (about 3 nm), AlOx (about 1.2 nm), CoFe (about 5 nm), and NiFe (about 15 nm) on the local interconnect lines 22. Thereafter, these stacked films are patterned to form the MTJ elements 23.

Moreover, after using the CVD method to form an insulating layer 30C with which the MTJ elements 23 are coated, for example, the insulating layer 30C on the MTJ elements 23 is removed by the CMP method, so that only the side surfaces of the MTJ elements 23 are coated with the insulating layer 30C.

Figure 43:
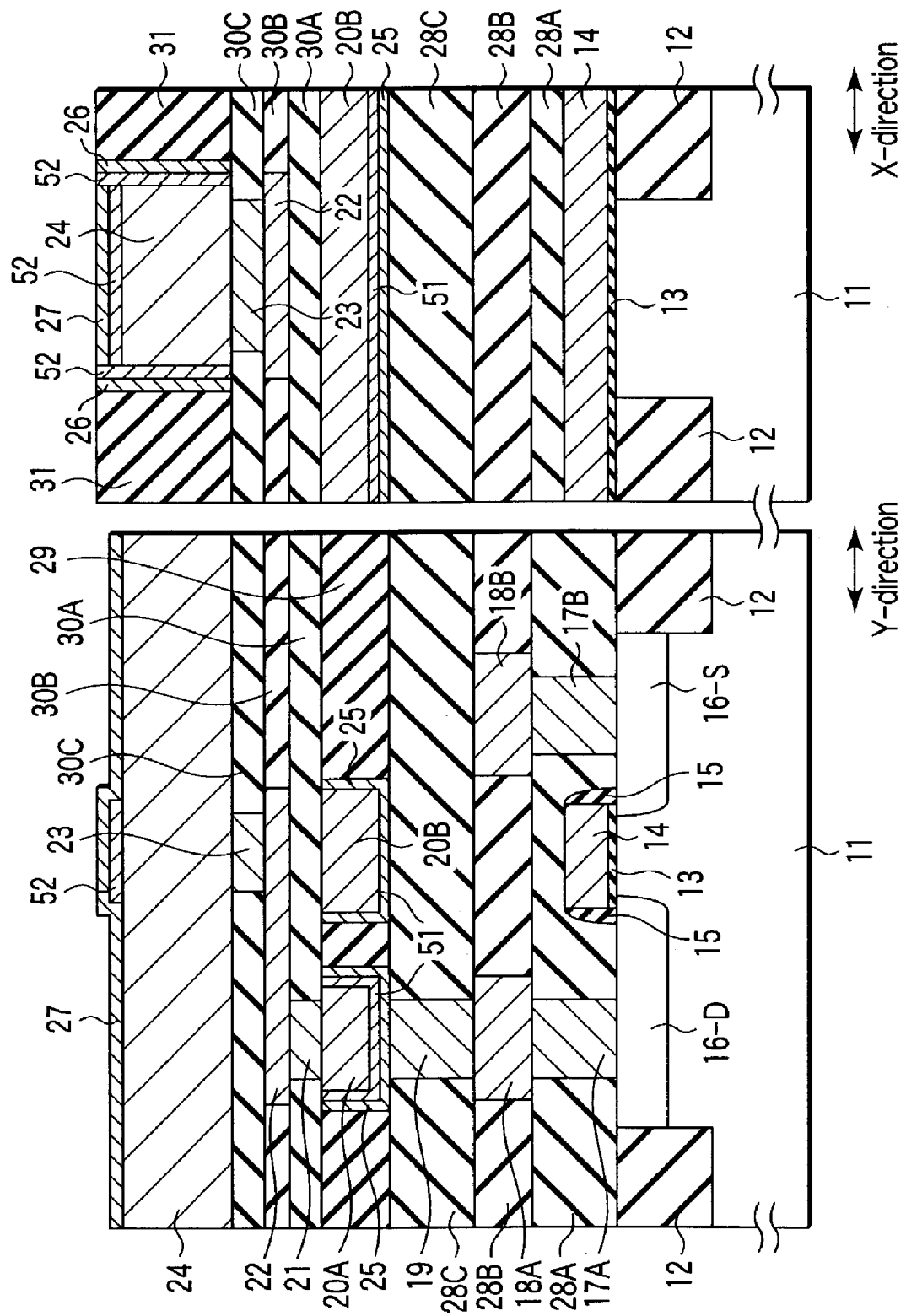
FIG. 43 is a sectional view showing one step of the manufacturing method of the device structure of Example 3.

Next, as shown in FIG. 43, the CVD method is used to form an insulating layer 31 on the insulating layer 30C. The PEP and RIE methods are used to form the wiring trench in the insulating layer 31 on the MTJ element 23.

The CVD and RIE methods are used to form the yoke material (e.g., NiFe) 26 in a thickness of about 50 nm on the side wall portion of the wiring trench of the insulating layer 31. Similarly, the CVD and RIE methods are used to form the hard magnetic material (e.g., Fe) 52 in a thickness of about 50 nm on the side wall portion of the wiring trench of the insulating layer 31.

Thereafter, by the sputter method, on the insulating layer 31, the conductive material (e.g., the metal film such as aluminum and copper) is formed with which the wiring trench is completely filled). Subsequently, the conductive material is polished by the CMP to form the data selection line (read/write bit line) 24. Furthermore, the CVD, PEP, and RIE methods are used to form the hard magnetic material 52 and yoke material 27 only on the data selection line 24.

By the above-described steps, the magnetic random access memory according to Example 3 (FIGS. 34 and 35) is completed.

It is to be noted that in the present manufacturing method, the metal wirings 20A, 20B, 24 are formed by the damascene process. However, for example, the RIE process may also be used to form the metal wirings 20A, 20B, 24.

Moreover, in the present manufacturing method, a barrier metal (e.g., the stacked layer of Ti and TiN, stacked layer of Ta and TaN, and the like) may also be formed before the conductive layer is formed to constitute the wiring or plug. In this case, an order in which the barrier metal, yoke material, and hard magnetic material are formed is not especially limited.

8. OTHERS

In the description of the manufacturing methods according to Reference Examples 1, 2 and Examples 1 to 3, the examples of the magnetic random access memory in which one MTJ element and read selection switch (MOS transistor) constitute the memory cell and which includes the write word line and data selection line (read/write bit line) have been described.

However, naturally the present invention is not limited to the magnetic random access memory including this cell array structure, and can also be applied to all the magnetic random access memories.

The present invention can also be applied, for example, to a magnetic random access memory which does not include the read selection switch, magnetic random access memory in which the read bit line is disposed separately from the write bit line, magnetic random access memory in which the bits are stored in one MTJ element, and the like.

As described above, according to the magnetic random access memory of the embodiment of the present invention, the hard magnetic material is disposed in a part of the surface of the write word line and write bit-line. Therefore, after the assembly, the direction of residual magnetization of the hard magnetic material is determined by the unit of the write word line or write bit line, and the characteristic (TMR curve) of the MTJ element can be corrected.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A magnetic random access memory comprising:
   a memory cell which is formed on a semiconductor substrate and in which a magneto resistive effect is used;
   a first write line which is disposed right under the memory cell and which extends in a first direction;
   a second write line which is disposed right on the memory cell and which extends in a second direction intersecting with the first direction; and
   a hard magnetic material with which a part of the surface of the first write line is coated,
   wherein the hard magnetic material is separated from the memory cell.

2. The magnetic random access memory according to claim 1, wherein lower and side surfaces of the first write line are coated with the hard magnetic material.

3. The magnetic random access memory according to claim 1, wherein a magnetization easy axis of the hard magnetic material with which a lower surface of the first write line is coated is directed in the second direction.

4. The magnetic random access memory according to claim 1, further comprising:
   a yoke material with which a part of the surface of the first write line is coated,
   wherein the hard magnetic material is disposed between the first write line and yoke material.

5. The magnetic random access memory according to claim 1, further comprising:
   a yoke material with which a part of the surface of the first write line is coated,
   wherein the yoke material is disposed between the first write line and hard magnetic material.

6. The magnetic random access memory according to claim 1, further comprising:
   a yoke material with which a part of the surface of the second write line is coated.

7. A magnetic random access memory comprising:
   a memory cell which is formed on a semiconductor substrate and in which a magneto resistive effect is used;
   a first write line which is disposed right under the memory cell and which extends in a first direction;
   a second write line which is disposed right on the memory cell and which extends in a second direction intersecting with the first direction; and
   a hard magnetic material with which a part of the surface of the second write line is coated,
   wherein the hard magnetic material is separated from the memory cell.

8. The magnetic random access memory according to claim 7, wherein upper and side surfaces of the second write line are coated with the hard magnetic material.

9. The magnetic random access memory according to claim 7, wherein a magnetization easy axis of the hard magnetic material with which an upper surface of the second write line is coated is directed in the first direction.

10. The magnetic random access memory according to claim 7, further comprising:
    a yoke material with which a part of the surface of the second write line is coated,
    wherein the hard magnetic material is disposed between the second write line and yoke material.

11. The magnetic random access memory according to claim 7, further comprising:
    a yoke material with which a part of the surface of the second write line is coated,
    wherein the yoke material is disposed between the second write line and hard magnetic material.

12. The magnetic random access memory according to claim 7, further comprising:
    a yoke material with which a part of the surface of the first write line is coated.

* * * * *